(12) United States Patent
Akahane

(10) Patent No.: US 8,933,714 B2
(45) Date of Patent: Jan. 13, 2015

(54) LEVEL SHIFT CIRCUIT USING PARASITIC RESISTOR IN SEMICONDUCTOR SUBSTRATE

(71) Applicant: Fuji Electric Co., Ltd., Kawasaki-shi (JP)

(72) Inventor: Masashi Akahane, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 117 days.

(21) Appl. No.: 13/861,488

(22) Filed: Apr. 12, 2013

(65) Prior Publication Data

US 2013/0293247 A1 Nov. 7, 2013

(30) Foreign Application Priority Data

Apr. 12, 2012 (JP) ................. 2012-090994

(51) Int. Cl.
*G01R 27/28* (2006.01)
*G11C 19/00* (2006.01)
(Continued)

(52) U.S. Cl.
CPC .............. *H03K 17/56* (2013.01); *G01R 27/02* (2013.01); *H03K 17/04123* (2013.01); *H03K 17/145* (2013.01); *H03K 17/162* (2013.01); *H03K 2217/0063* (2013.01); *H03K 2217/0072* (2013.01); *H03K 2217/0081* (2013.01)
USPC .......................................... 324/705; 326/81

(58) Field of Classification Search
CPC ...... G01R 27/02; G01R 27/025; G01R 27/14; G01L 1/20; G01L 1/22; G01L 1/225; H03K 17/145; H03K 17/162; H03K 17/56; H03K 17/04123; H02M 3/285; H02M 7/49; H02M 7/5387; H03M 1/00; H03M 1/12; H03M 1/46
USPC ........ 324/705, 691, 649, 600; 326/62, 63, 68, 326/80, 81, 82, 83; 327/78, 315, 321, 331, 327/333, 380, 381, 382; 363/56.05, 56.02, 363/70, 71, 132; 365/80, 81
See application file for complete search history.

(56) References Cited

U.S. PATENT DOCUMENTS 5,801,418 A * 9/1998 Ranjan .......................... 257/336
6,304,208 B1 * 10/2001 Nagashima ................... 341/172
(Continued)

FOREIGN PATENT DOCUMENTS

JP 09-172366 A 6/1997
JP 3214818 B2 7/2001
(Continued)

*Primary Examiner* — Hoai-An D Nguyen
(74) *Attorney, Agent, or Firm* — Rossi, Kimms & McDowell LLP

(57) ABSTRACT

A level shift circuit in which no adverse effect is produced on a delay time, regardless of the resistance values of resistors. The level shift circuit includes an operation detection circuit that outputs a nseten signal and a nresen signal in response to a state of output from first and second series circuits, a latch malfunction protection circuit connected to the operation detection circuit, a latch circuit connected through first to sixth resistors to first and second level shift output terminals of the first and second series circuits, first and second parasitic resistors, and third and fourth switching elements connected in parallel therewith, and fifth and sixth switching elements connected to a power source potential, a connection point of the first and second resistors or a connection point of the third and fourth resistors, and the operation detection circuit.

7 Claims, 21 Drawing Sheets

(51) Int. Cl.
*H03K 17/56* (2006.01)
*G01R 27/02* (2006.01)
*H03K 17/0412* (2006.01)
*H03K 17/14* (2006.01)
*H03K 17/16* (2006.01)

(56) References Cited

U.S. PATENT DOCUMENTS

| | | | |
|---|---|---|---|
| 6,351,399 B2 * | 2/2002 | Takanashi et al. | 363/56.05 |
| 7,133,487 B2 * | 11/2006 | Lin | 326/68 |
| 7,772,912 B2 * | 8/2010 | Yen et al. | 327/333 |
| 8,482,038 B2 * | 7/2013 | Sasaki et al. | 257/210 |
| 2006/0197554 A1 * | 9/2006 | Jinta | 326/81 |
| 2011/0134710 A1 | 6/2011 | Akahane | |

FOREIGN PATENT DOCUMENTS

| | | |
|---|---|---|
| JP | 3941206 B2 | 4/2007 |
| JP | 2011-139423 A | 7/2011 |

\* cited by examiner

LEVEL SHIFT CIRCUIT USING PARASITIC RESISTOR IN SEMICONDUCTOR SUBSTRATE

BACKGROUND OF THE INVENTION

1. Field of the Invention

Embodiments of the invention are related to methods and configurations for preventing malfunctions, shortening delay times, reducing current consumption and/or reducing circuit areas for circuits, such as, for example, level shift circuits.

2. Description of the Related Art

In a half-bridge circuit in which switching elements are connected in series and driven by a high-potential power source, a level shift circuit is used for driving a high-potential-side switching element by a signal of a low-potential system. In a level shift circuit, a wire bonding system is sometimes used for connection between circuit blocks with a large difference in electrical potential, but the use of the wire bonding system adversely affects cost and product miniaturization capability because, for example, the number of operations is increased and a wiring space is necessary. Therefore, there is a demand for a level shift circuit using no wire bonding system. A level shift circuit using a parasitic resistor, such as described in Japanese Patent Publication No. 3941206 and Japanese Patent Publication No. 3214818, can be considered as a level shift circuit using no wire bonding system.

FIG. 1 shows the configuration of a half-bridge circuit 100 using the conventional level shift circuit which uses the techniques disclosed in Japanese Patent No. 3941206 and Japanese Patent Application Publication No. 2011-139423. The half-bridge circuit 100 shown in FIG. 1 is constituted by an output circuit 110, a high-potential-side drive circuit 120, and a low-potential-side drive circuit 130. The output circuit 110 is connected to the high-potential-side drive circuit 120 and the low-potential-side drive circuit 130. Synchronized signals are inputted from the outside to the high-potential-side drive circuit 120 and the low-potential-side drive circuit 130.

The output circuit 110 is configured of a switching element XD1, a switching element XD2, a power source E, and a load L1. In the output circuit 110, the switching element XD1 is connected in series with the switching element XD2 which is connected in parallel with the load L1, and the high-voltage power source E supplies power to the load L1 via the switching element XD1. The switching element XD1 is a high-potential-side switching element and can be, for example, an N-channel or P-channel MOS transistor or a P-type or N-type insulated gate bipolar transistor (IGBT). The switching element XD2 is a low-potential side switching element and can be, for example, an N-channel MOS transistor or an N-type IGBT. In the explanation below, the switching element XD1 and the switching element XD2 are assumed to be N-channel MOS transistors.

The high-potential-side drive circuit 120 is configured of a level shift circuit, a high-side driver 123, and a power source E1 (the output voltage thereof is also denoted by E1 hereinbelow). The level shift circuit is a component of the high-potential-side drive circuit 120, other than the high-side driver 123 and the power source E1, and configured of a latch malfunction protection circuit 121, a latch circuit 122, a first series circuit 124, a second series circuit 125, resistors R1 and R2 (the resistance values thereof are also denoted by R1 and R2, respectively), P-channel MOS transistors (referred to hereinbelow as PM) 1 and PM 2, a diode D1, a diode D2, an inverter INV, and a parasitic resistor Rpar3 present between the first series circuit 124 and the second series circuit 125.

The latch malfunction protection circuit 121 receives input of a setdrn signal and a resdrn signal.

The first series circuit 124 is configured by connecting a parasitic resistor Rpar1 in a semiconductor substrate and a high-withstand-voltage N channel MOSFET (referred to hereinbelow as HVN) 1 in series and outputs a level shift output signal setdrn (referred to hereinbelow as setdrn signal) to the latch malfunction protection circuit 121 via a first connection point Vsetb (the potential thereof is also denoted by Vsetb). The first series circuit 124 is provided with a first level shift output terminal (that corresponds to the first connection point Vsetb) for outputting the setdrn signal to the latch malfunction protection circuit 121, and the first level shift output terminal is connected to the latch malfunction protection circuit 121.

The second series circuit 125 is configured by connecting a parasitic resistor Rpar2 in a semiconductor substrate and a HVN2 in series and outputs a level shift output signal resdrn (referred to hereinbelow as resdrn signal) to the latch malfunction protection circuit 121 via the HVN2 and a second connection point Vrstb (the potential thereof is also denoted by Vrstb). The second series circuit 125 is provided with a second level shift output terminal (corresponds to the second connection point Vrstb) for outputting the resdrn signal to the latch malfunction protection circuit 121, and the second level shift output terminal is connected to the latch malfunction protection circuit 121.

The PM1 is connected in parallel with the resistor Rpar1 constituting the first series circuit 124. The PM2 is connected in parallel with the resistor Rpar2 constituting the second series circuit 125. One end (connection point) of the resistor R1 is connected to a gate terminal of the PM2, and one end (connection point) of the resistor R2 is connected to a gate terminal of the PM1. A feedback circuit is constituted by the invertor INV, resistors R1 and R2, and PM1 and PM2. The parasitic resistances Rpar1 and Rpar2 and resistance values of the resistors R1 and R2 are assumed to satisfy the conditions: Rpar1=Rpar2 and R1=R2.

The latch malfunction protection circuit 121 receives input of the setdrn signal and resdrn signal. The latch malfunction protection circuit 121 serves to prevent the output from assuming a high impedance and adversely affecting the latch circuit 122 when an error signal called dV/dt noise which is caused by parasitic capacitances Cds1, Cds2 between sources and drains of HVN1, HVN2 (concerning the dV/dt noise, see, for example, Japanese Patent Application Publication No. 2011-139423) is generated, that is, when the potential Vsetb and the potential Vrstb are both at the L (Low) level. Except for the case in which the potential Vsetb and the potential Vrstb are both at the L (Low) level, the latch malfunction protection circuit 121 directly passes and outputs the setdrn signal and resdrn signal, or outputs signals obtained by processing based on the setdrn signal and resdrn signal (for example, the output signal is taken as 1 and is at the H level when the setdrn signal and resdrn signal set the latch circuit 122, the L level when the latch circuit is reset, and a high impedance when the latch circuit is not changed).

The latch circuit 122 is connected to the latch malfunction protection circuit 121 and the high-side driver 123. The latch circuit 122 receives the output from the latch malfunction protection circuit 121 and stores and outputs a value that is set or reset according to whether this input is L or H. Where the input is a high impedance, the latch circuit holds and outputs a value that has been stored immediately before the input became a high impedance.

The output terminal of the latch circuit 122 is connected through the resistor R2 to the second connection point Vrstb which is the connection point of the parasitic resistor Rpar2 and the HVN2 constituting the second series circuit 125. Further, the output of the latch circuit 122 is inverted by the inverter INV, whereby the inverted output of the latch circuit 122 is obtained. The output terminal of the inverter INV that outputs the inverted output is connected through the resistor R1 to the first connection point Vsetb which is the connection point of the parasitic resistor Rpar1 and the HVN1 constituting the first series circuit 124.

The high-side driver 123 is connected to the high-potential-side switching element XD1 and the latch circuit 122, outputs a signal HO in response to the output of the latch circuit 122, and ON/OFF controls the switching element XD1. The output terminal of the high-side driver 123 is connected to the gate terminal of the switching element XD1. The low-potential-side power supply terminals of the latch malfunction protection circuit 121, latch circuit 122, high-side driver 123, and power source E1 are connected to a connection point vs (the potential thereof is also represented by vs hereinbelow) of the switching elements XD1 and XD2. Further, the latch malfunction protection circuit 121, latch circuit 122, and high-side driver 123 receive the supply of power from the power source E1. The low-potential-side power supply terminal of the inverter INV is likewise connected to the connection point vs, and the inverter receives the supply of power from the power source E1 (this configuration is not shown in the figure).

One terminal of the first series circuit 124 and one terminal of the second series circuit 125 are connected to a power supply line vb (the potential thereof is also represented by vb hereinbelow) connected to the high-potential side terminal of the power source E1, and other terminals of the series circuits are connected to a ground potential (GND). A set signal, which is the input signal to the level shift circuit of the high-potential-side drive circuit 120, is inputted to the gate of the HVN1, and a reset signal, which is the input signal to the level shift circuit of the high-potential-side drive circuit 120, is inputted to the gate of the HVN2.

The diodes D1 and D2 are connected by the anodes thereof to the connection point vs of the switching elements XD1 and XD2, the cathode of the diode D1 is connected to the first connection point Vsetb, and the cathode of the diode D2 is connected to the second connection point Vrstb. The diodes D1 and D2 clamp the voltages Vsetb and Vrstb to prevent them from falling to or below the potential vs and protect the latch malfunction prevention circuit 121 from an overvoltage input.

The resistors R1 and R2 are connected to the potential vb or potential vs through a PMOS or an NMOS constituting a CMOS circuit or a CMOS circuit for logical inversion (INV) that is used in the latch circuit 122, but for the sake of simplicity, the PMOS and NMOS are not shown in the latch circuit 122. Such simplification is also used hereinbelow.

The low-potential-side drive circuit 130 is constituted by a low-side driver 131 that ON/OFF controls the low-potential-side switching element XD2, and a power source E2 (the potential thereof is also represented by E2 hereinbelow) that supplies power to the low-side driver 131.

The power from the power source E2 is supplied to the low-side driver 131, and a signal S inputted to the low-side driver 131 is amplified and inputted to the gate terminal of the switching element XD2. With such a configuration, when the signal S is at the H (High) level, the switching element XD2 is ON (conduction), and when the signal is at the L (Low) level, the switching element XD2 is OFF (disconnection). Thus, the signal S directly indicates ON/OFF of the switching element XD2.

As for the set signal and reset signal inputted to the high-potential-side derive circuit 120, the set signal indicates the ON period start (OFF period end) timing of the switching element XD1, and the reset signal indicates the OFF period start (ON period end) timing of the switching element XD2.

The switching elements XD1 and XD2 are complementary ON/OFF switched so that when one is ON, the other is OFF, except within the below-described dead time period. When the switching element XD2 is ON, the potential vs of the connection point vs becomes the ground potential, and when the switching element XD1 is ON, the potential vs of the connection point vs becomes the output voltage E of the power source E. Further, the load L1 receives the supply of power from the half-bridge circuit 100 and is connected between the connection point vs and the ground potential.

In this case, the resistance value of the parasitic resistor varies depending on temperature, power source voltage, and the like. FIG. 2 shows the dependence of the resistance value of the parasitic resistor on temperature. As shown in FIG. 2, when the temperature is −50° C., the resistance value of the parasitic resistor is 3 kΩ, and when the temperature is 150° C., the resistance value becomes 10 kΩ. FIG. 3 shows an example of the dependence of the resistance value of the parasitic resistor on power source voltage. As shown in FIG. 3, when the vb-GND voltage is 0 V, the resistance value of the parasitic resistor is 3 kΩ, and when the vb-GND voltage is 800 V, the resistance value becomes 30 kΩ. Thus, the resistance value of the parasitic resistor, which is the resistor in the semiconductor substrate, shows dependence on temperature and dependence on power source voltage. Therefore, the rise time of the setdrn signal and resdrn signal changes depending on temperature or power source voltage conditions and can adversely affect the operation of the level shift circuit, as described hereinbelow.

Further, the resistance value of the parasitic resistor Rpar3 present between the first series circuit 124 and the second series circuit 125 changes depending on the distance between the HVN1 and the HVN2. FIG. 4 shows the dependence of the resistance value of the parasitic resistor Rpar3 on the distance between the HVN1 and the HVN2. As shown in FIG. 4, when the distance between the HVN1 and the HVN2 is 1000 the resistance value of the parasitic resistor Rpar3 is 500 kΩ.

In the level shift circuit shown in FIG. 1, for example, the resistance values of the parasitic resistors Rpar1 and Rpar2 are adjusted to about 10 kΩ, and the resistance value of the parasitic resistor Rpar3 is adjusted to about 500 kΩ. By increasing the resistance value of the parasitic resistor Rpar3, it is possible to reduce the adverse effect produced during operation of each level shift circuit.

In the half-bridge circuit 100 shown in FIG. 1, by connecting the output of the latch circuit 122 and the output of the inverter INV to one end of the resistors R1 and R2, it is possible to make the potential at one end of the resistors R1 and R2 equal to the potential vb or potential vs according to the output state of the latch circuit 122. When the output HO is at the L level (when the latch circuit 122 is in the reset state), the potential at one end of the resistor R1 is the potential vb, the parasitic resistor Rpar1 and the resistor R1 are in the parallel connection state, the potential at one end of the resistor R2 is the potential vs, and the parasitic resistor Rpar2 and the resistor R2 are in the series connection state. Therefore, the gate potential of the PM1 becomes lower than the potential vb, and the PM1 is not in the completely disconnected state, whereby the impedance between the first connection point Vsetb and the power source line vb is decreased. Meanwhile, when the gate potential of the PM2 is the potential vb and the PM2 is in the disconnected state, the impedance between the second connection point Vrstb and the power source line vb becomes higher than that in the case of the first connection point Vsetb. Further, since the potential at one end of the resistor R2 becomes the potential vs, the second connection point Vrstb is pulled down to the potential vs side. The output impedance against the potential vb of the connection point is lower for the first connection point Vsetb than for the second connection point Vrstb.

When the output HO is at the H level (when the latch circuit 122 is in the set state), the parasitic resistor Rpar1 and the resistor R1 are in the series connection state and the parasitic resistor Rpar2 and the resistor R2 are in the parallel connection state. The gate potential of the PM2 becomes lower than the potential vb, and the PM2 is not in the completely disconnected state, whereby the impedance between the second connection point Vrstb and the power source line vb is decreased. Meanwhile, when the gate potential of the PM1 is the potential vb and the PM1 is in the disconnected state, the impedance between the first connection point Vsetb and the power source line vb becomes higher than that in the case of the second connection point Vrstb. Further, since the potential at one end of the resistor R1 becomes the potential vs, the first connection point Vsetb is pulled down to the potential vs side. The output impedance against the potential vb of the connection point is higher for the first connection point Vsetb than for the second connection point Vrstb.

Therefore, the latch circuit 122 is configured to be set or reset anew so that even when the dV/dt noise occurs and both the potential of the first connection point Vsetb and the potential of the second connection point Vrstb decrease, the two potentials return to the H level at different speeds and the potential with the lower return speed eventually holds the state preceding the occurrence of the dV/dt noise, thereby making it possible to avoid the effect of the dV/dt noise.

FIG. 5 shows an operation time chart of the level shift circuit shown in FIG. 1. Where the input pulse of the set signal is switched to the H level at a point of time $t_1$, the setdrn signal decreases to the potential vs and the latch output starts rising to the H level. As long as the input pulse of the set signal is at the H level, the setdrn signal is continuously at the level of potential vs. Where the output of the latch circuit 122 is switched from the L level to the H level at a point of time $t_2$, the parallel/series connection states of the resistors R1 and R2 are switched. Where the input pulse of the set signal is switched from the H level to the L level at a point of time $t_3$, the setdrn signal rises. Where the input pulse of the reset signal is switched to the H level at a point of time $t_4$, the resdrn signal decreases to the potential vs and the latch output starts decreasing to the L level. As long as the input pulse of the reset signal is at the H level, the resdrn signal is continuously at the level of potential vs.

Where the output of the latch circuit 122 is switched from the H level to the L level at a point of time $t_5$, the parallel/series connection states of the resistors R1 and R2 are switched. Where the input pulse of the reset signal is switched from the H level to the L level at a point of time $t_6$, the resdrn signal rises.

Where the inversion (setting) timing of the output of the latch circuit 122 is earlier than the input pulse width of the set signal, the impedance of the output of the first series circuit 124 at the time the setdrn signal starts rising is in the high state, the time constant of the time constant circuit constituted by the first series circuit and the parasitic capacitor Cds1 increases and the connection to the level of potential vs through the resistor R1 is realized. Therefore, the rise of the setdrn signal is delayed.

Further, since the parasitic resistors Rpar1 and Rpar2 are used as level shift resistors, this rising time changes, as described hereinabove, under the effect of temperature and power source voltage. As shown in FIG. 2 and FIG. 3, where the temperature or voltage increases, the resistance values of the parasitic resistors Rpar1 and Rpar2 increase. Where the resistance values of the parasitic resistors Rpar1 and Rpar2 thus increase, the delay of the rise of the setdrn signal and resdrn signal increases, but where the pulses of the set signal and reset signal are generated separately, even if the rise of the setdrn signal and resdrn signal is somewhat delayed, this delay causes no problem. However, the setdrn signal and resdrn signal are both at the L level in the case where the resistance values of the parasitic resistors Rpar1 and Rpar2 are large, the set signal—reset signal pulse spacing is narrow, the pulses of the set signal and reset signal are generated continuously, and the subsequent pulse falls while the preceding pulse is still rising. Where the setdrn signal and resdrn signal are both at the L level, the state identical to that in which the dV/dt noise occurs is realized, the resultant shortcoming being that the setdrn signal or resdrn signal which intrinsically should pass therethrough by the latch malfunction protection circuit 121 is blocked. Therefore, the subsequent pulse becomes effective after the preceding pulse has risen, the delay time increases, as shown in FIG. 5, and the responsiveness is degraded. Where the resistance value of the level shift resistor is decreased in order to avoid such a shortcoming associated with the occurrence of a period in which both the setdrn signal and the resdrn signal are at the L level, even if the signals are normal, when the HVN is ON and the dV/dt noise occurs, the electric current flowing in the level shift resistor increases and current consumption rises.

FIG. 6 shows circuit simulation results obtained for the half-bridge circuit 100 shown in FIG. 1 in the case where the set signal—reset signal pulse spacing is 0.5 μs. FIG. 7 shows circuit simulation results obtained for the half-bridge circuit 100 shown in FIG. 1 in the case where the set signal—reset signal pulse spacing is 0.2 μs. As shown in FIG. 6, where the set signal—reset signal pulse spacing is 0.5 μs, the output waveform of the latch output when the resistance value of the parasitic resistor is 5 kΩ (shown by a broken line) is the same as that when the resistance value of the parasitic resistor is 35 kΩ (shown by a solid line)

However, as shown in FIG. 7, where the output waveform when the resistance value of the parasitic resistor is 5 kΩ is compared with the output waveform when the resistance value of the parasitic resistor is 35 kΩ in the case in which the set signal—reset signal pulse spacing is 0.2 μs, a delay caused by a block in the latch malfunction prevention circuit 121 occurs in the output waveform of the latch output when the resistance value of the parasitic resistor is 35 kΩ. Therefore, a level shift circuit is needed in which the delay time is not affected, regardless of the set signal—reset signal pulse spacing and the resistance values of parasitic resistors. Thus, as described above, there is a need in the art for an improved level shift circuit.

SUMMARY OF THE INVENTION

Embodiments of the invention address this and other needs. Embodiments of the invention provide a level shift circuit including: a first series circuit in which a first parasitic resistor in a semiconductor substrate, a first switching element connected to an input terminal for receiving input of a first level shift input signal, and a first level shift output terminal for outputting a first level shift output signal are connected in series; a second series circuit in which a second parasitic resistor in a semiconductor substrate, a second switching element connected to an input terminal for receiving input of a second level shift input signal, and a second level shift output terminal for outputting a second level shift output signal are connected in series; an operation detection circuit that is connected to the first series circuit and the second series circuit, receives input of the first level shift output signal and the second level shift output signal outputted from the first series circuit and the second series circuit, respectively, and outputs the first level shift output signal, the second level shift output signal, a first detection signal, and a second detection signal, wherein the first detection signal is outputted from a first terminal of the operation detection circuit and is at a low level in response to a first state in which the first level shift output signal is at a low level and the second level shift output signal is at a high level, and the second detection signal is outputted from a second terminal of the operation detection circuit and is at a low level in response to a second state in which the first level shift output signal is at a high level and the second level shift output signal is at a low level; a latch malfunction protection circuit that inputs the first level shift output signal and the second level shift output signal from the operation detection circuit, outputs a high-impedance signal when both the first level shift output signal and the second level shift output signal are at a low level, and passes and outputs the first level shift output signal and the second level shift output signal without any modification, or outputs a signal obtained by processing on the basis of the first level shift output signal and the second level shift output signal when both the first level shift output signal and the second level shift output signal are not at a low level; a latch circuit that receives output from the latch malfunction protection circuit, and when the output from the latch malfunction protection circuit is at a low level or a high level, stores a value thereof and outputs the stored value together with an inverted value thereof, and when the output from the latch malfunction protection circuit is at a high impedance, holds a value that has been stored immediately before the input assumes a high impedance and outputs the stored value together with the inverted value of the stored value, wherein one of output terminals of the latch circuit is connected through a first resistor, a second resistor, and a third resistor to the first level shift output terminal, and the other one of output terminals of the latch circuit is connected through a fourth resistor, a fifth resistor, and a sixth resistor to the second level shift output terminal; a third switching element connected in parallel to the first parasitic resistor, wherein a source terminal of the third switching element is connected to a power source potential, a drain terminal of the third switching element is connected to the first level shift output terminal, and a gate terminal of the third switching element is connected to the second level shift output terminal; a fourth switching element connected in parallel to the second parasitic resistor, wherein a source terminal of the fourth switching element is connected to a power source potential, a drain terminal of the fourth switching element is connected to the second level shift output terminal, and a gate terminal of the fourth switching element is connected to the first level shift output terminal; a fifth switching element in which a source terminal is connected to the power source potential, a drain terminal is connected between the first resistor and the second resistor, and a gate terminal is connected to the first terminal of the operation detection circuit; and a sixth switching element in which a source terminal is connected to the power source potential, a drain terminal is connected between the fourth resistor and the fifth resistor, and a gate terminal is connected to the second terminal of the operation detection circuit.

Embodiments of the invention include a seventh switching element in which a source terminal is connected to the power source potential, a drain terminal is connected between the second resistor and the third resistor, and a gate terminal is connected to the second terminal of the operation detection circuit; and an eighth switching element in which a source terminal is connected to the power source potential, a drain terminal is connected between the fifth resistor and the sixth resistor, and a gate terminal is connected to the first terminal of the operation detection circuit.

Embodiments of the invention provide an operation detection circuit that includes a logical circuit group constituted by a first inverter, a second inverter, a third inverter, a fourth inverter, a first NAND element, and a second NAND element; an input terminal of the first inverter and one input terminal of the first NAND element are connected to the first level shift output terminal; an input terminal of the second inverter and one input terminal of the second NAND element are connected to the second level shift output terminal; an input terminal of the third inverter and another input terminal of the second NAND element are connected to an output terminal of the first inverter; an input terminal of the fourth inverter and another input terminal of the first NAND element are connected to an output terminal of the second inverter; and the first terminal of the operation detection circuit is an output terminal of the second NAND element, and the second terminal of the operation detection circuit is an output terminal of the first NAND element.

Embodiments of the invention provide a resistance ratio of a combined resistance value of the first parasitic resistor and the first to third resistors is adjusted such that a potential level of a signal inputted to each of the logical circuit groups in the operation detection circuit is at a high level with respect to the logical circuit groups when an output of the one output terminal of the latch circuit is at a low level and the first parasitic resistor and the first to third resistors are in a series connection state; and a resistance ratio of a combined resistance value of the second parasitic resistor and the fourth to sixth resistors is adjusted such that a potential level of a signal inputted to each of the logical circuit groups in the operation detection circuit is at a high level with respect to the logical circuit groups when an output of the other output terminal of the latch circuit is at a low level and the second parasitic resistor and the fourth to sixth resistors are in a series connection state.

Embodiments of the invention provide a series combined resistance value of the second resistor and the third resistor is equal to or less than a resistance value of the first parasitic resistor; and a series combined resistance value of the fifth resistor and the sixth resistor is equal to or less than a resistance value of the second parasitic resistor.

Embodiments of the invention provide an inverter is connected between the latch circuit and the first resistor.

Embodiments of the invention provide, in the first state, a resistance value of the first resistor is determined by a current consumption tolerance value in the first resistor and a maximum value of the power source potential, and resistance values of the first parasitic resistor, the second resistor, and the third resistor are determined on the basis of the determined resistance value of the first resistor; and in the second state, a resistance value of the second resistor is determined by a current consumption tolerance value in the second resistor and a maximum value of the power source potential, and resistance values of the second parasitic resistor, the fifth resistor, and the sixth resistor are determined on the basis of the determined resistance value of the second resistor.

By using the level shift circuit in accordance with certain embodiments of the invention, it is possible to realize the operation without a delay of latch output even when the set signal—reset signal pulse spacing is short. At the same time, since the relationship of impedances relating to the combined resistors of the level shift circuit for preventing the malfunction caused by the dV/dt noise acts to prevent the malfunction in each operation mode, the durability against the dV/dt noise can be maintained.

DETAILED DESCRIPTION

Figure 1:
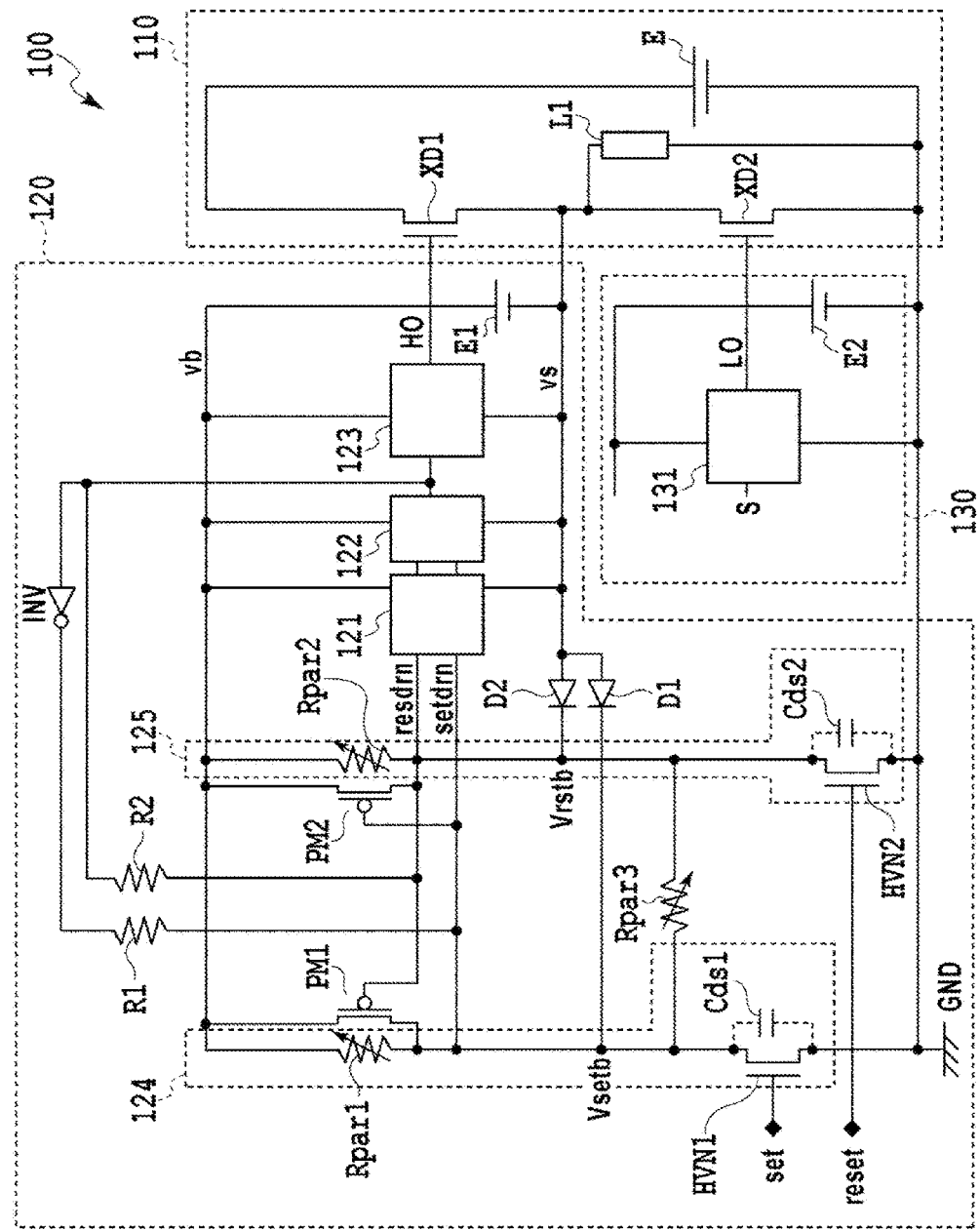
FIG. 1 is a configuration diagram of a half-bridge circuit using the conventional level shift circuit.
Figure 2:
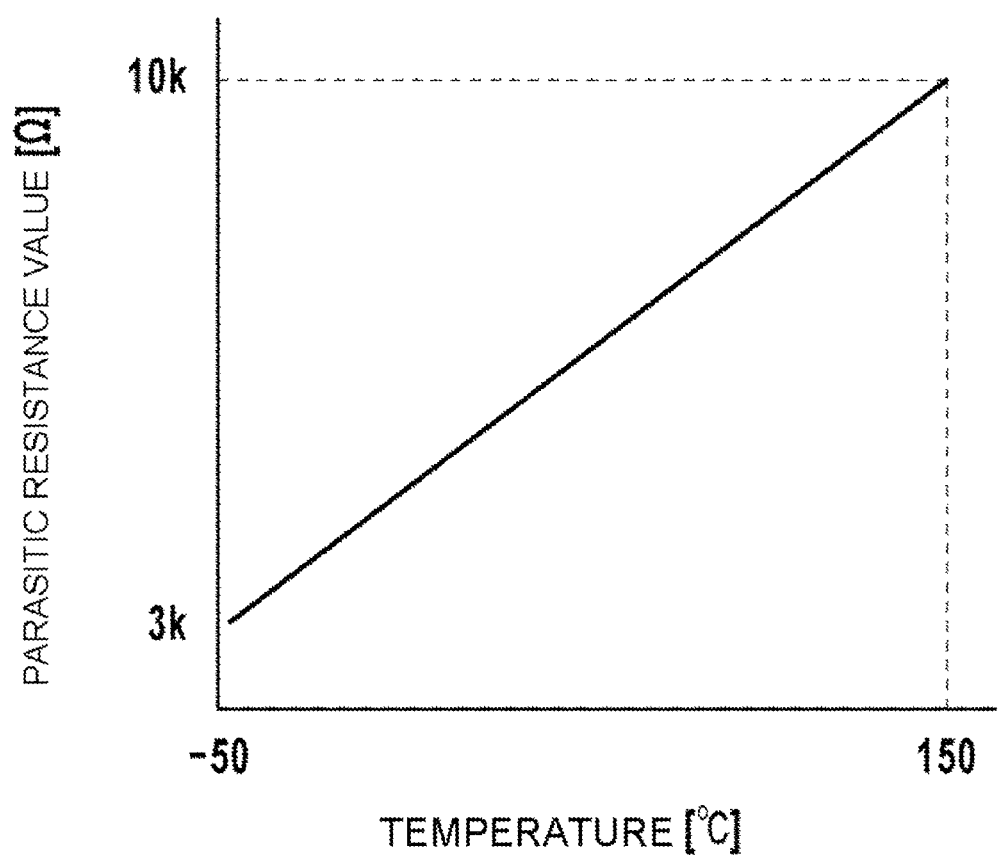
FIG. 2 illustrates how the resistance value of a parasitic resistor depends on temperature.
Figure 8:
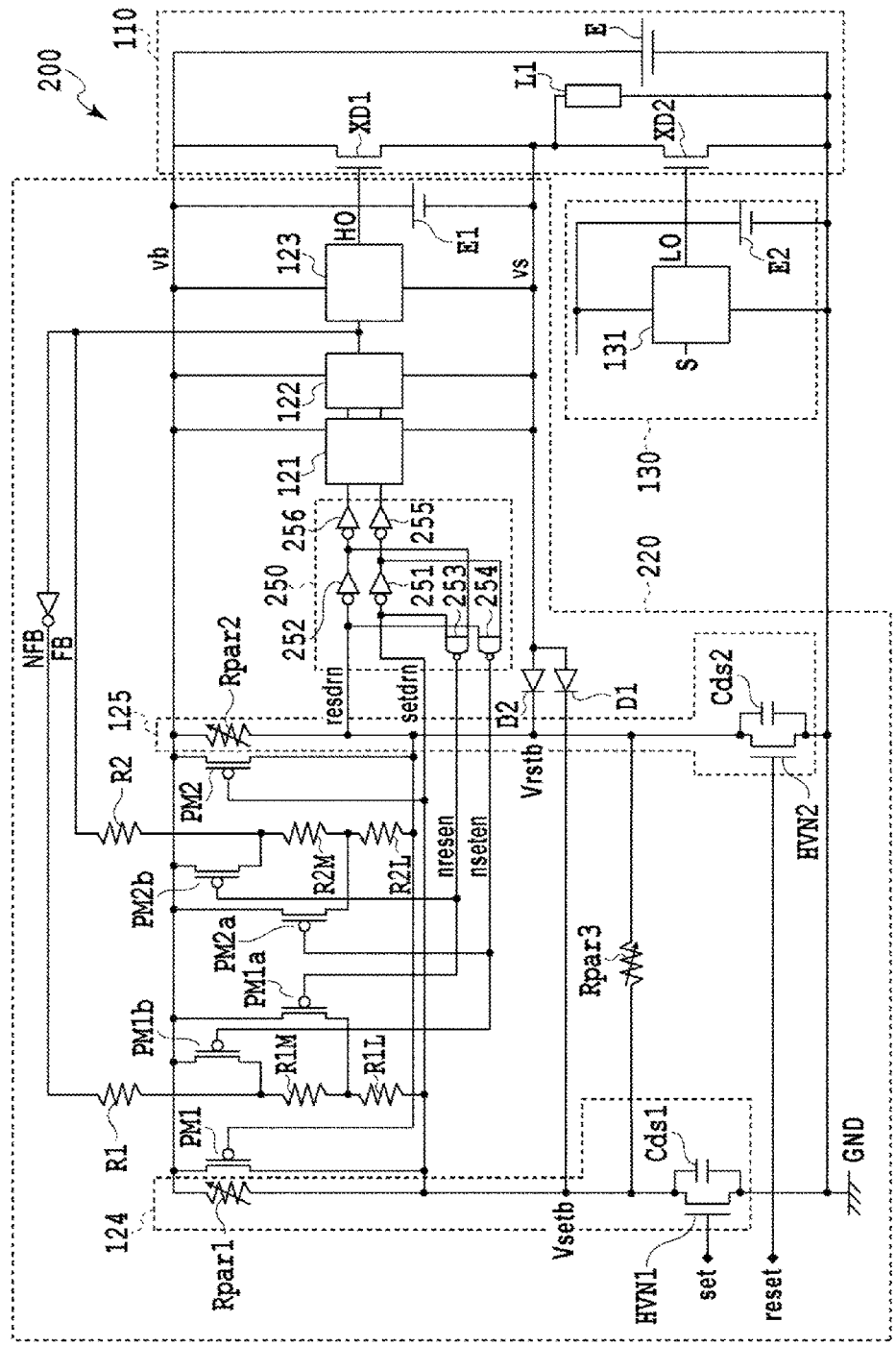
FIG. 8 shows the configuration of a half-bridge circuit using the level shift circuit in accordance with embodiments of the invention.

FIG. 8 shows the configuration of a half-bridge circuit using the level shift circuit in accordance with embodiments of the invention. The components common with the configuration shown in FIG. 1 are assigned with same reference numerals and detailed explanation thereof is herein omitted. As shown in FIG. 8, the difference between a half-bridge circuit 200 using the level shift circuit in accordance with the present invention and the half-bridge circuit 100 shown in FIG. 1 is that the former further includes a PM1a and a PM1b, a PM2a and a PM2b, resistors R1M, R2M, R1L, and R2L, and an operation detection circuit 250. The resistance values of parasitic resistors Rpar1 and Rpar2 in a high-potential-side drive circuit 220 of the half-bridge circuit 200 shown in FIG. 8 can be controlled as described in Japanese Patent Publication No. 3941206.

One terminal of the resistor R1M is connected to the resistor R1, and the other terminal is connected to one terminal of the resistor R1L. The other terminal of the resistor R1L is connected to the gate terminal of the PM2. One terminal of the resistor R2M is connected to the resistor R2, and the other terminal is connected to one terminal of the resistor R2L. The other terminal of the resistor R2L is connected to the gate terminal of the PM1.

The source terminal of the PM1b is connected to the power supply line vb, the drain terminal of the PM1b is connected to a connection point of the resistor R1 and the resistor R1M, and the gate terminal of the PM1b is connected to the operation detection circuit 250. The source terminal of the PM2b is connected to the power supply line vb, the drain terminal of the PM2b is connected to a connection point of the resistor R2 and the resistor R2M, and the gate terminal of the PM2b is connected to the operation detection circuit 250.

The source terminal of the PM1a is connected to the power supply line vb, the drain terminal of the PM1a is connected to a connection point of the resistor R1M and the resistor R1L, and the gate terminal of the PM1a is connected to the operation detection circuit 250. The source terminal of the PM2a is connected to the power supply line vb, the drain terminal of the PM2a is connected to the connection point of the resistor R2M and the resistor R2L, and the gate terminal of the PM2a is connected to the operation detection circuit 250.

The operation detection circuit 250 is provided with inverters 251, 252, 255, and 256 and NAND elements 253 and 254. The inverter 251 is connected to the first level shift output terminal of the first series circuit 124, and the inverter 252 is connected to the second level shift output terminal of the second series circuit 125. One input terminal of the NAND element 253 is connected to the first level shift output terminal, and the other input terminal is connected to the output terminal of the inverter 252 and outputs the nresen signal to the gate terminals of the PM1a and PM2b. One input terminal of the NAND element 254 is connected to the second level shift output terminal, and the other input terminal is connected to the output terminal of the inverter 251 and outputs the nseten signal to the gate terminals of the PM1b and PM2a. The input terminal of the inverter 255 is connected to the output terminal of the inverter 251, and the output terminal of the inverter 255 is connected to the latch malfunction protection circuit 121. The input terminal of the inverter 256 is connected to the output terminal of the inverter 252, and the output terminal of the inverter 256 is connected to the latch malfunction protection circuit 121.

The operation detection circuit 250 outputs an L-level nseten signal when the setdrn signal is at the L level and the resdrn signal is at the high level and outputs an L-level nresen signal when the setdrn signal is at the H level and the resdrn signal is at the L level. In other cases, the nseten signal and nersen signal are at the H level.

Figure 9:
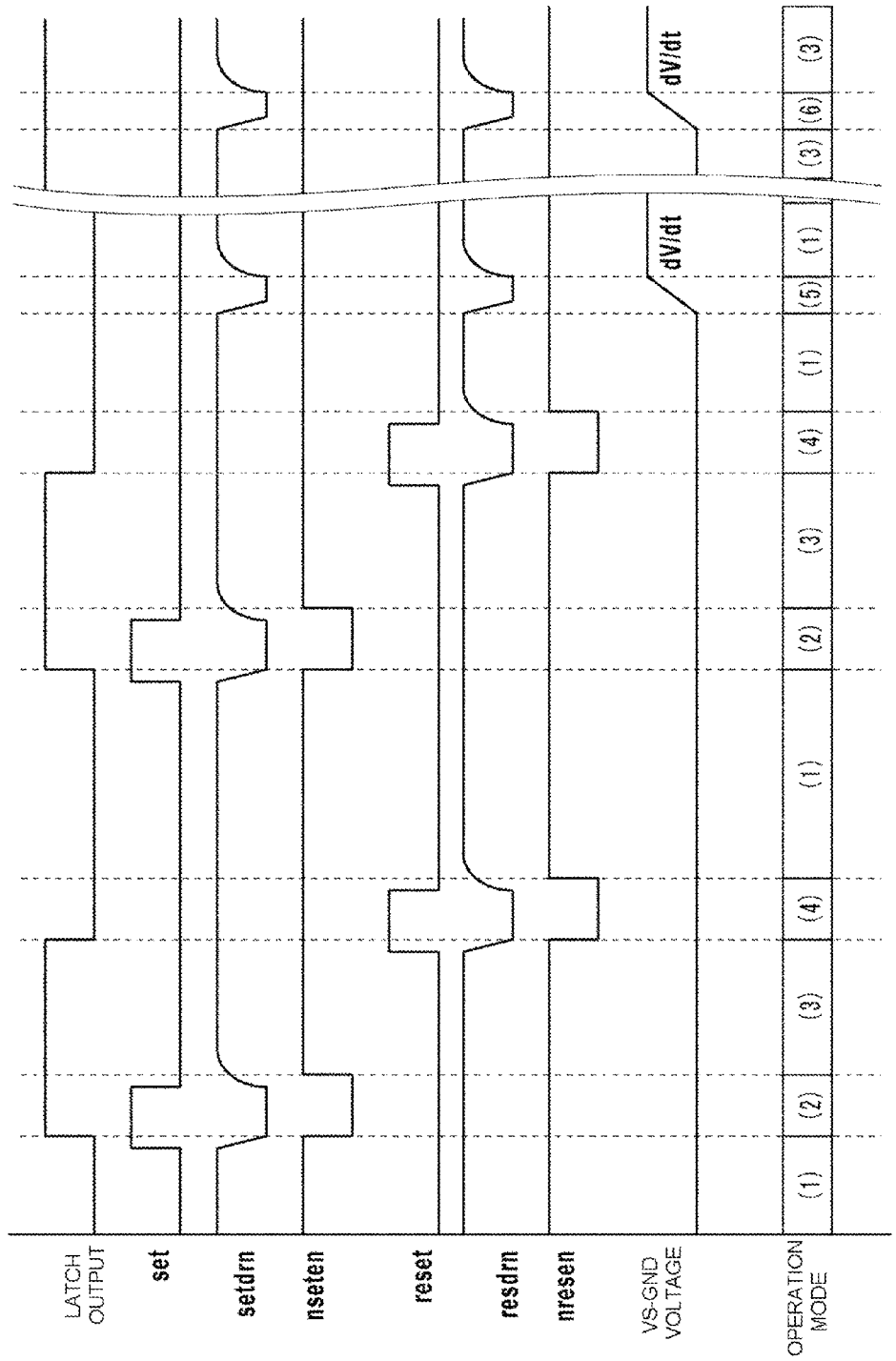
FIG. 9 shows the operation time charts and operation mode of the level shift circuit in accordance with embodiments of the invention.

FIG. 9 shows the operation time charts and operation mode of the level shift circuit in accordance with embodiments of the invention. In FIG. 9, the operation time charts of latch output, set signal, setdrn signal, nseten signal, reset signal, resdrn signal, nresen signal, vs-GND voltage, and operation mode are shown. The operation mode shown in FIG. 9 is divided into operation modes (1) to (6) on the basis of the signal state of the abovementioned signal outputs. The circuit states relating to each operation mode of the half-bridge circuit using the level shift circuit in accordance with certain embodiments will be explained below with reference to FIG. 9.

Figure 10:
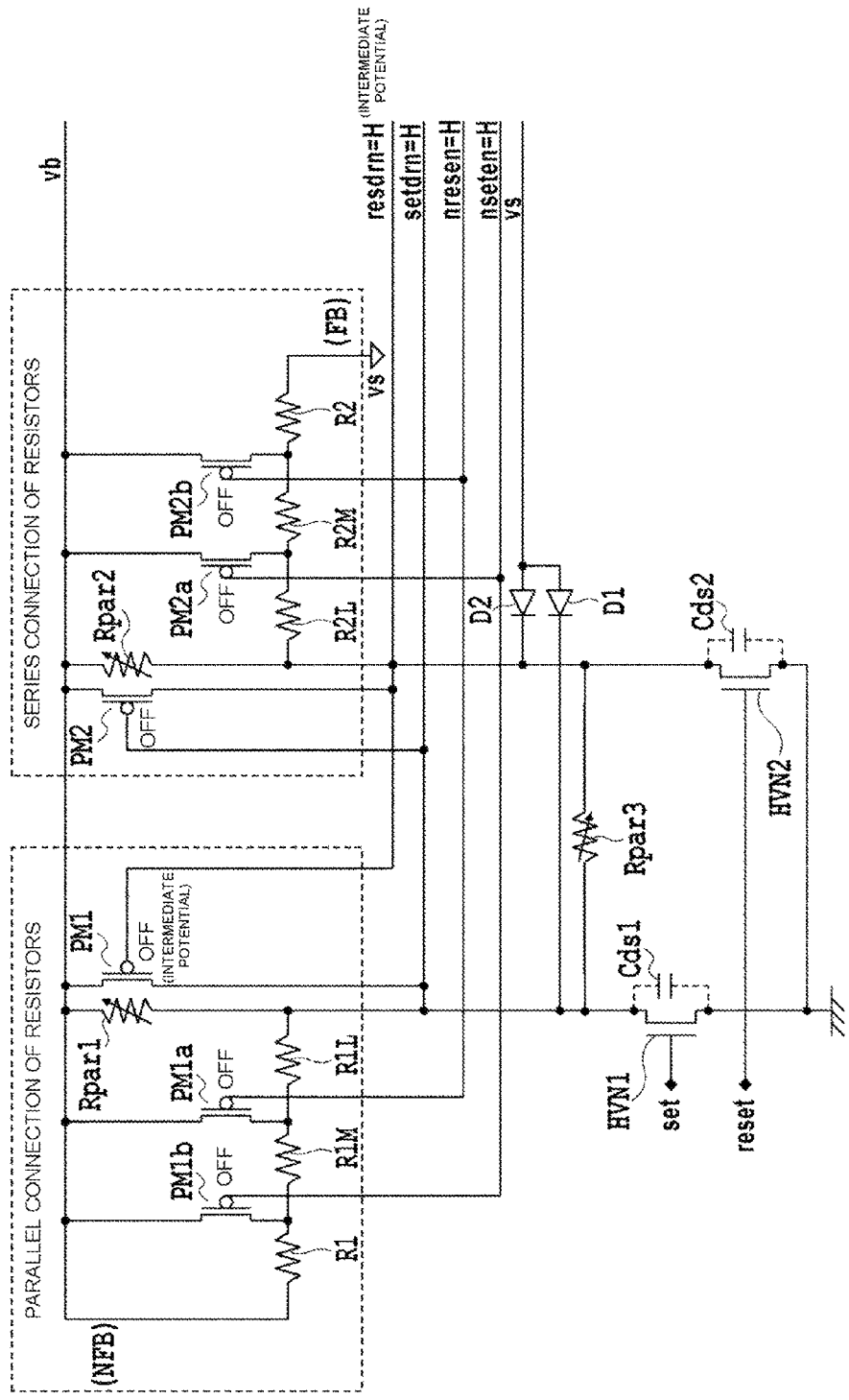
FIG. 10 illustrates the circuit state of the level shift circuit in accordance with embodiments of the invention in operation mode (1)

FIG. 10 shows the circuit state of the level shift circuit in accordance with some embodiments of the invention in the operation mode (1). As shown in FIG. 9, in the operation mode (1), the latch output is in the reset state (L level), the set signal and reset signal are at the L level, and the setdrn signal, nseten signal, resdrn signal and nresen signal are at the H level.

As shown in FIG. 10, the PM1 to 1b and the PM2 to 2b are all in the OFF state, a feedback signal FB from the latch circuit 122 is at the L level (=potential vs), and an inverted signal NFB of the feedback signal FB applied to one end of the resistor R1 is at the H level (=potential vb). Therefore, the set-side level shift circuit is in the resistor parallel connection state, and the reset-side level shift circuit is in the resistor series connection state. In the PM1, the gate voltage is lower than the potential vb, and therefore a state that should be referred to as a half-OFF state is assumed. Since the reset-side level shift circuit is in the resistor series connection state, the potential of the resdrn signal applied to the gate terminal of the PM1 is an intermediate potential of the potential vb and potential vs due to resistor voltage division by the parasitic resistor Rpar2 and series combined resistor (R2+R2M+R2L). Therefore, a state is assumed in which the vb-setdrn impedance on the set side is lower than the vb-resdrn impedance on the reset side. The state of resistor voltage division in this case is shown schematically in FIG. 16.

Figure 16:
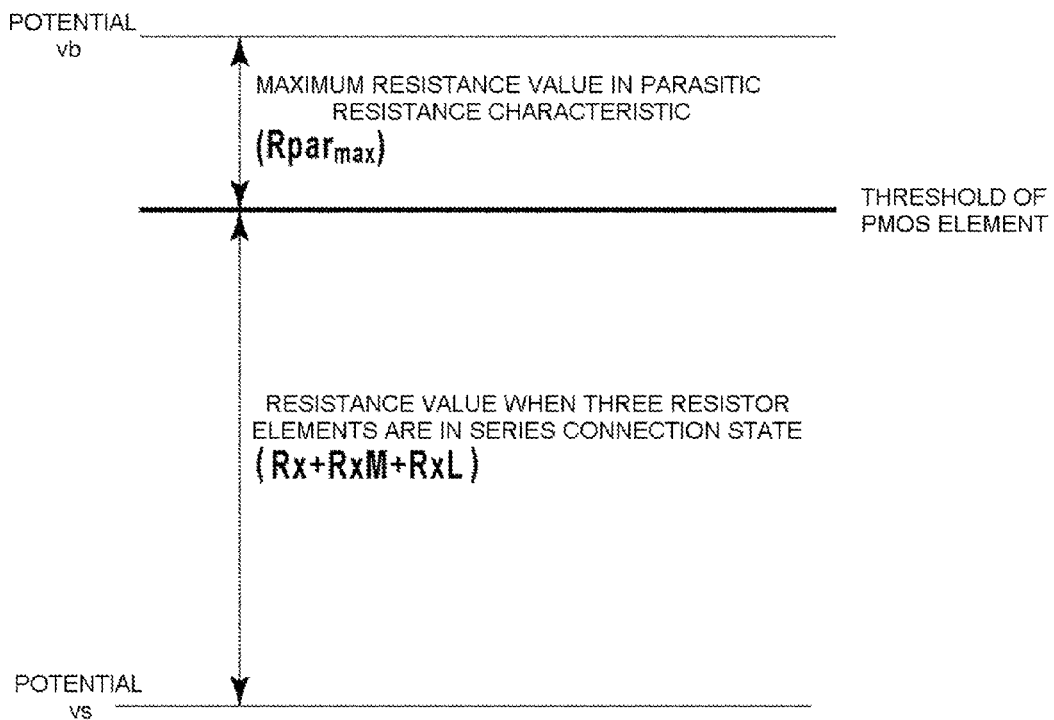
FIG. 16 shows the resistance ratio relationship of the level shift circuit.

FIG. 16 shows the resistance ratio relationship of the maximum resistance value $Rpar_{max}$ in a parasitic resistance characteristic and a combined resistance value (Rx+RxM+RxL) in a series connection state of three resistors Rx, RxM, and RxL (x is 1 or 2). Since the logical elements 251 to 256 of the operation detection circuit 250 disposed at the last stage of the level shift circuit output are of a CMOS structure, a through current flows to the logical elements 251 to 256 at a certain set value of the intermediate potential. Accordingly, as shown in FIG. 16, by setting the resistance ratio within a range in which the threshold of the PMOS elements of the logical elements 251 to 256 of the operation detection circuit 250 is not exceeded (the range in which the difference in voltage between the divided voltage value of vb determined by this resistance ratio and the potential vb is less than the threshold of PMOS elements, and the divided voltage value of vb can be considered to be at the H level with respect to the logical elements of the operation detection circuit 250), it is possible to reduce the through current to the logical elements 251 to 256 of the operation detection circuit 250 and, at the same time, obtain the effect of increasing the durability against the dV/dt noise by providing a difference in output impedance between the output terminals outputting the setdrn signal and resdrn signal.

As shown in FIG. 9, immediately prior to switching from the operation mode (1) to the operation mode (2), the set signal is switched to the H level, the setdrn signal also starts switching from the H level to the L level by following this switching, and when the setdrn signal reaches the L level, the latch output is switched to the H level, the nseten signal is switched to the L level, and the operation mode (2) is started.

Figure 11:
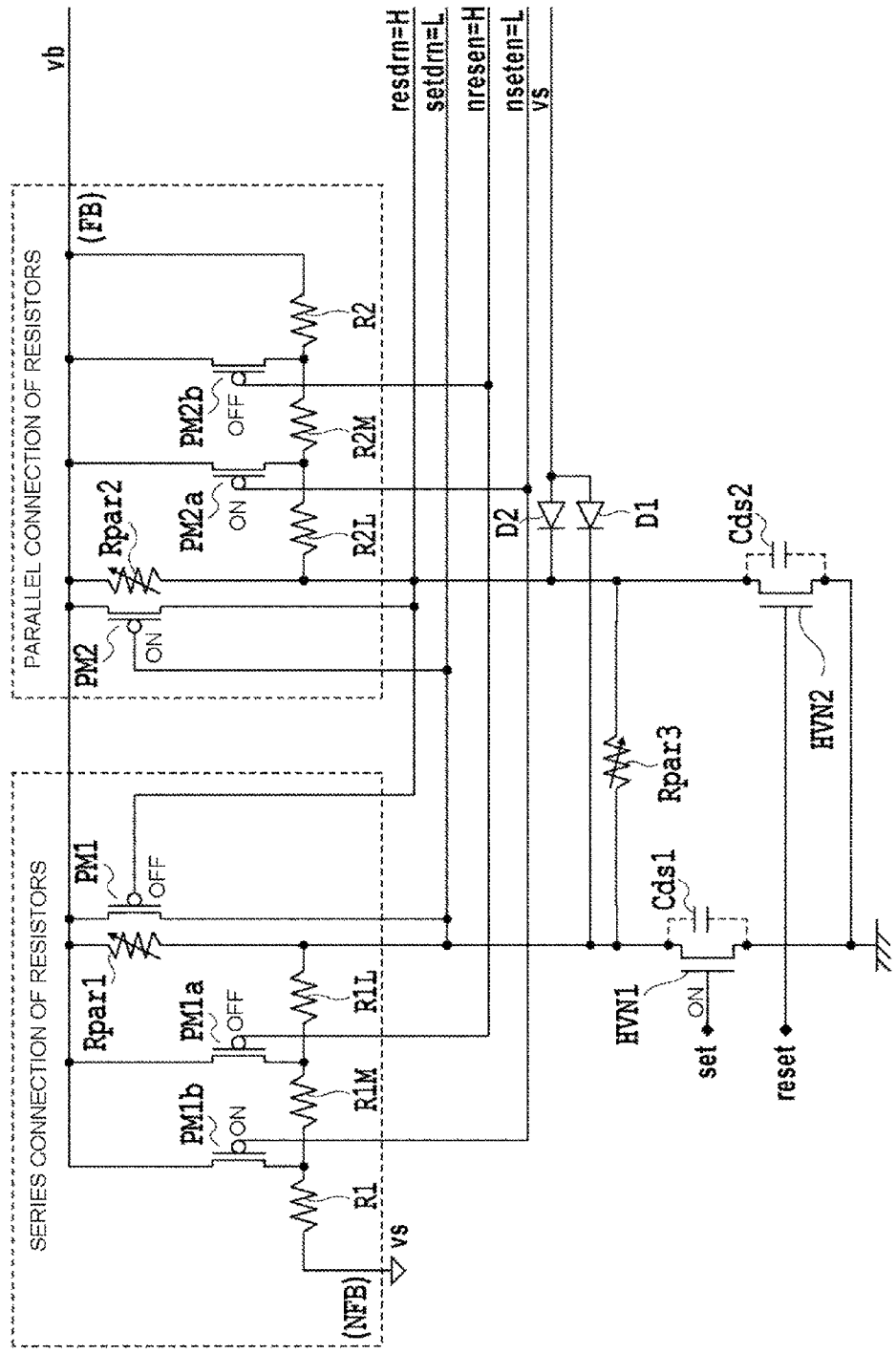
FIG. 11 illustrates the circuit state of the level shift circuit in accordance with embodiments of the invention in operation mode (2)

FIG. 11 shows the circuit state of the level shift circuit in accordance with some embodiments of the invention in the operation mode (2). As shown in FIG. 9, in the operation mode (2), the latch output is in the set state (H level), the set signal, resdrn signal, and nresen signal are at the H level, and the reset signal, setdrn signal, and nseten signal are at the L level. The HVN1 is in the ON state.

As shown in FIG. 11, when the setdrn signal is at the L level, the PM2 is ON, but since the HVN2 is in the OFF state, the resdrn signal remains at the H level. Since the setdrn signal is at the L level and the resdrn signal is at the H level, the nseten signal is at the L level and the PM1b and the PM2a are ON. Since the HVN2 is in the OFF state, the ON state of the PM2a does not affect the resdrn signal, but the combined resistance of the reset-side level shift circuit becomes a parallel combined resistance (ON resistance of Rpar2//R2U/PM2). Further, since the PM1b is in the ON state, the combined resistance of the set-side level shift circuit becomes Rpar1//(R1M+R1L). This resistance value determines the rise time of the setdrn signal when the HVN1 is in the OFF state, but where the PM1b is set ON, the series resistor of R1M and R1L is connected in parallel to the parasitic resistor Rpar1 and the combined resistance value can be made less than that of the parasitic resistor Rpar1 alone. Therefore, the rise time can be shortened by comparison with that of the conventional level shift circuit, and the response delay relating to the next reset signal can be inhibited.

Figure 17:
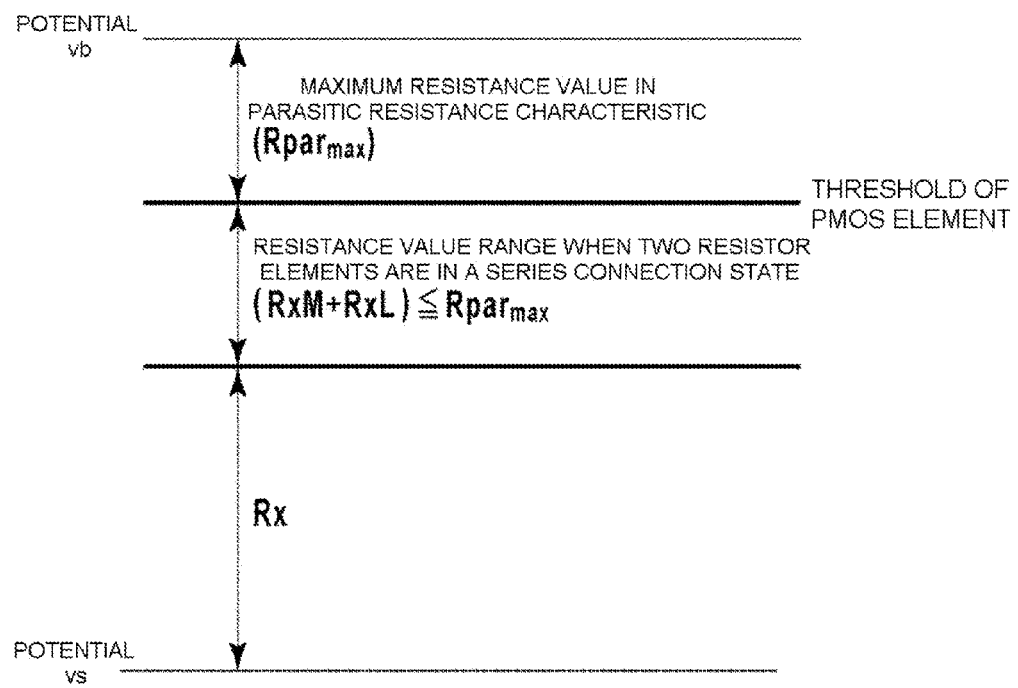
FIG. 17 shows the resistance ratio relationship of the level shift circuit.

FIG. 17 shows the relationship of resistance ratios of the maximum resistance value $Rpar_{max}$ in the parasitic resistance characteristic, the combined resistance value (RxM+RxL) obtained in the series connection state of the two resistors RxM and RxL, and the resistance value of the resistor Rx. In this case, where the combined resistance value (RxM+RxL) is set equal to or less than the resistance value of the parasitic resistance $Rpar_{max}$, the resistance value Rparx//(RxM+RxL) of the combined resistor of the set-side level shift circuit decreases to a value equal to or less than half of the resistance value of the parasitic resistance $Rpar_{max}$, and therefore the response time can be shortened.

Further, since the PM1b is in the ON state in the circuit state realized in the operation mode (2), the resistor R1 is connected between vb and vs through the PM1b and therefore the electric current obtained from the relationship between the difference in potential between vb and vs and the resistance R1 is consumed. Accordingly, current consumption in the operation mode (2) can be reduced by determining in advance the current consumption tolerance value for the current flowing in the resistor R1 in the operation mode (2), determining the resistance value of the resistor R1 by dividing the maximum value $(vb-vs)_{max}$ of voltage (vb-vs) by the determined current consumption tolerance value, and determining the resistance value of the parasitic resistor Rpar1 and the resistance values of the resistors R1M and R1L on the basis of the determined resistance value of the resistor R1. In the below-described operation mode (4), current consumption in the operation mode (4) can be similarly reduced by determining in advance the current consumption tolerance value for the current flowing in the resistor R2, determining the resistance value of the resistor R2 by dividing the maximum value $(vb-vs)_{max}$ of voltage (vb-vs) by the determined current consumption tolerance value, and determining the resistance value of the parasitic resistor Rpar2 and the resistance values of the resistors R2M and R2L on the basis of the determined resistance value of the resistor R2.

Further, the resistance value of the combined resistors of the set-side and reset-side level shift circuits in the circuit state during the operation mode (2) is small on the reset side and large on the set side. As a result, even when the dV/dt noise is generated when the set signal is inputted, the impedance on the reset side is low. Therefore, the rise of the resdrn signal outputted from the reset-side level shift circuit is advanced, the rise of the setdrn signal outputted from the set-side level shift circuit is delayed, a set shape is obtained again even when the dV/dt noise is generated in the latch circuit 122 in the set state, and the malfunction can be prevented.

As shown in FIG. 9, immediately prior to switching from the operation mode (2) to the operation mode (3), the set signal is switched to the L level, and the setdrn also starts switching from the L level to the H level by following this switching. When the setdrn signal exceeds a predetermined threshold of the latch malfunction protection circuit 121, the nseten signal is switched to the H level, and the operation mode (3) is started.

Figure 12:
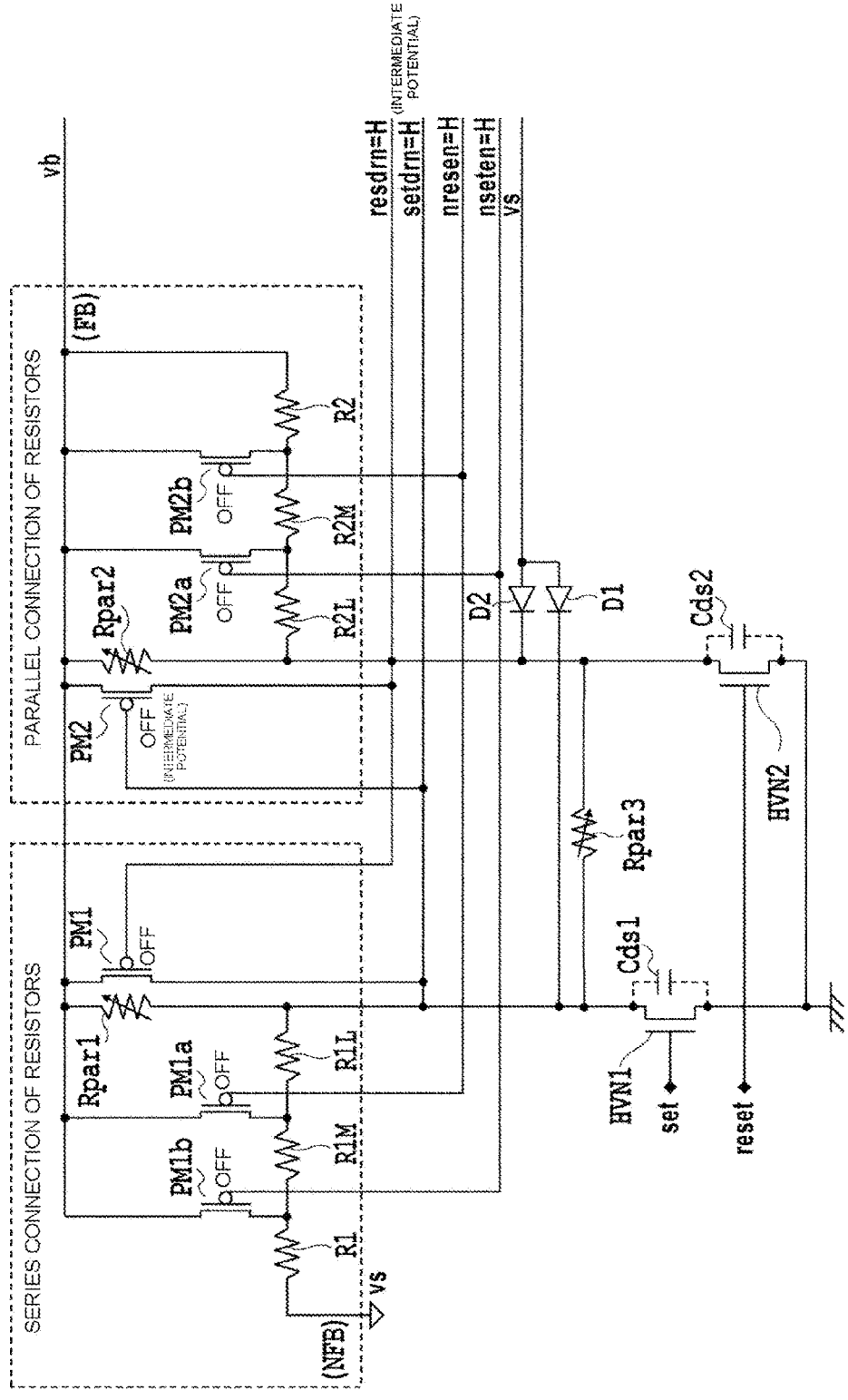
FIG. 12 illustrates the circuit state of the level shift circuit in accordance with embodiments of the invention in operation mode (3)

FIG. 12 shows the circuit state of the level shift circuit in accordance with some embodiments of the invention in the operation mode (3). As shown in FIG. 9, in the operation mode (3), the latch output is in the set state (H level), the set signal and reset signal are at the L level, and the setdrn signal, nseten signal, resdrn signal, and nresen signal are at the H level.

As shown in FIG. 12, the PM1 to 1b and PM2 to 2b are all in the OFF state, the feedback signal FB from the latch circuit 122 is at the H level, and the signal NFB applied to one end of the resistor R1 is at the L level. Therefore, the set-side level shift circuit assumes the resistor series connection state, and the reset-state shift circuit assumes the resistor parallel connection state. Further, in the PM2, the gate voltage is lower than the potential vb, and therefore a state that should be referred to as a half-OFF state is assumed. Since the set-side level shift circuit is in the resistor series connection state, the potential of the resdrn signal applied to the gate terminal of the PM2 is an intermediate potential of the potential vb and potential vs due to resistor voltage division by the parasitic resistor Rpar1 and series combined resistor (R1+R1M+R1L). Therefore, a state is assumed in which the vb-setdrn impedance on the set side is lower than the vb-resdrn impedance on the reset side As shown in FIG. 9, immediately prior to switching from the operation mode (3) to the operation mode (4), the reset signal is switched to the H level, and the resdrn signal also starts switching from the H level to the L level by following this switching. When the resdrn signal reaches the L level, the latch output is switched to the L level, the nresen signal is switched to the L level, and the operation mode (4) is started. The HVN2 is in the ON state.

Figure 13:
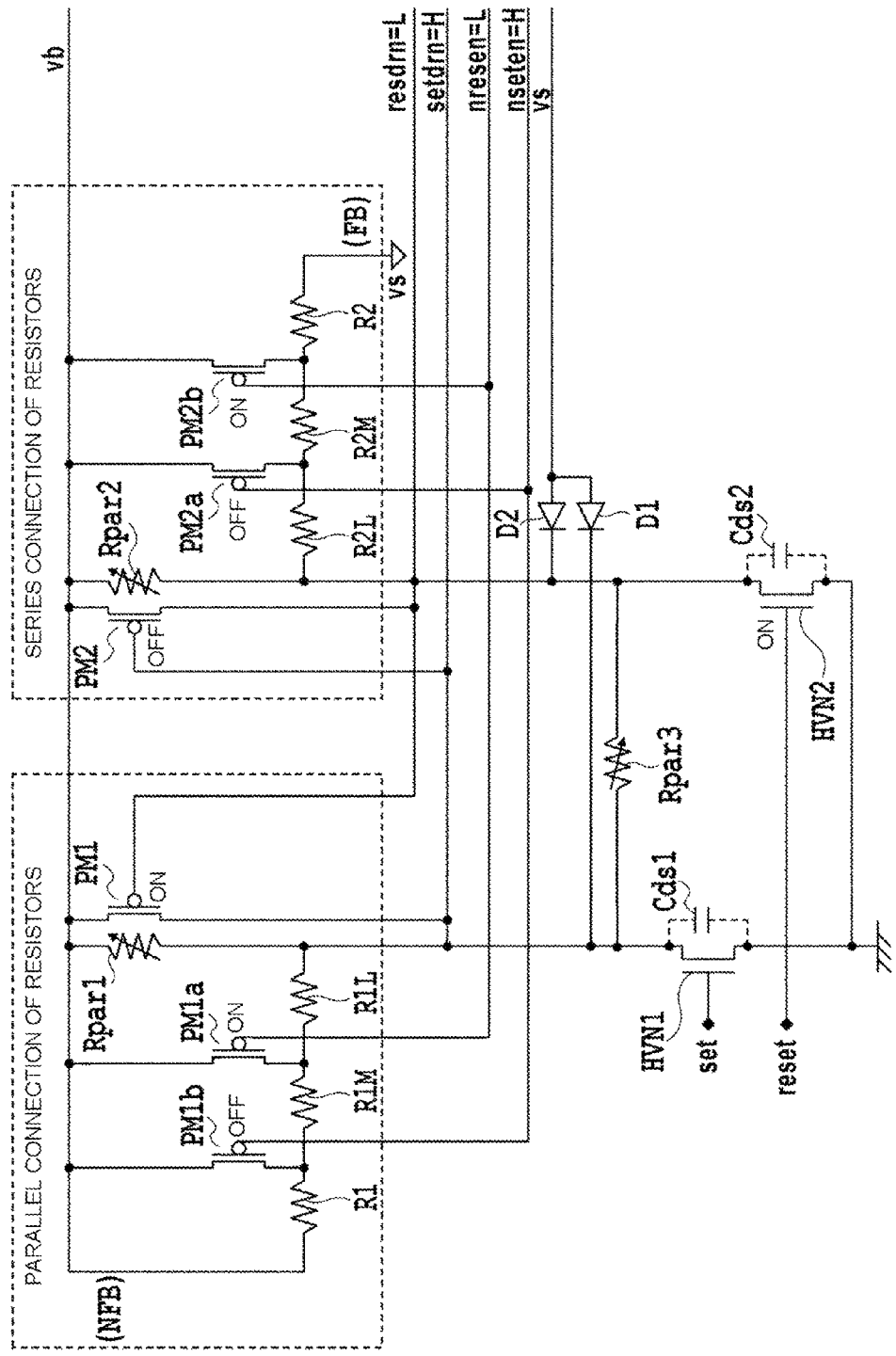
FIG. 13 illustrates the circuit state of the level shift circuit in accordance with embodiments of the invention in operation mode (4)

FIG. 13 shows the circuit state of the level shift circuit in accordance with some embodiments of the invention in the operation mode (4). As shown in FIG. 13, when the resdrn signal is at the L level, the PM1 is in the ON state, but the HVN1 is in the OFF state, and therefore the setdrn signal remains at the H level. Since the setdrn signal is at the H level and the resdrn signal is at the L level, the nresen signal is at the L level and the PM2b and PM1a are ON. Since the HVN1 is in the OFF state, the ON state of the PM1a does not affect the setdrn signal, and the combined resistance of the set-side level shift circuit becomes (ON resistance of Rpar1//R1L//PM1). Further, since the PM2b is in the ON state, the combined resistance of the reset-side level shift circuit becomes Rpar2//(R2M+R2L). This resistance value determines the rise time of the resdrn signal when the HVN2 is in the OFF state, but where the PM2b is set ON, the series resistor of R2M and R2L is connected in parallel to the parasitic resistor Rpar2 and the combined resistance value can be made less than that of the parasitic resistor Rpar2 alone. Therefore, the rise time can be shortened by comparison with that of the conventional level shift circuit, and the response delay relating to the next set signal can be inhibited.

In this case, the resistance value of the combined resistors of the set-side and reset-side level shift circuits in the circuit state is small on the set side and large on the reset side. As a result, even when the dV/dt noise is generated when the reset signal is inputted, the impedance on the set side is low. Therefore, the rise of the setdrn signal outputted from the set-side level shift circuit is advanced, the rise of the resdrn signal outputted from the reset-side level shift circuit is delayed, a reset shape is obtained again even when the dV/dt noise is generated in the latch circuit 122 in the reset state, and the malfunction can be prevented.

As shown in FIG. 9, immediately prior to switching from the operation mode (4) to the operation mode (1), the reset signal is switched to the L level, and the resdrn signal also starts switching from the L level to the H level by following this switching. When the resdrn signal exceeds a predetermined threshold of the latch malfunction protection circuit 121, the nresen signal is switched to the H level, and the operation mode (1) is started.

Figure 14:
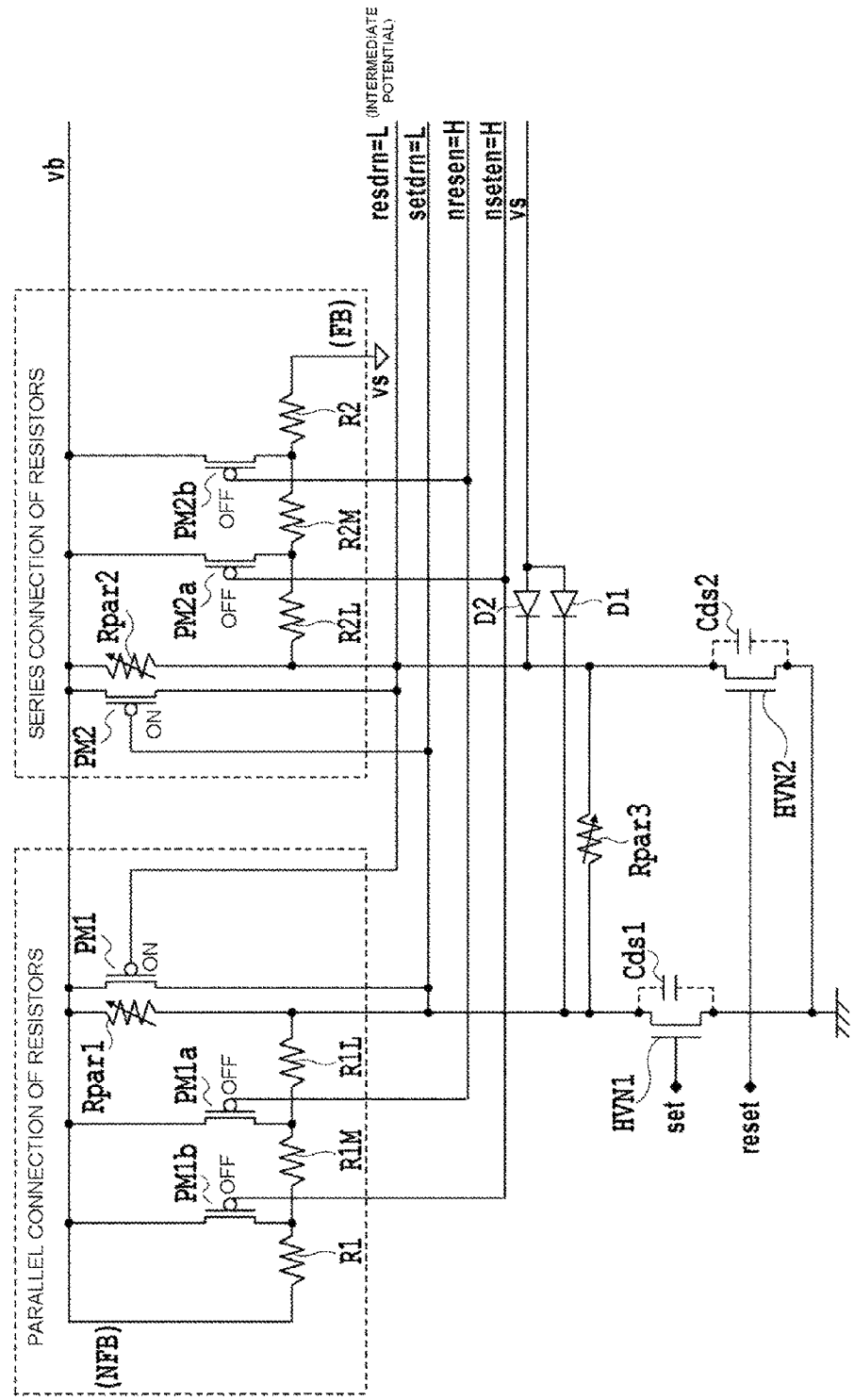
FIG. 14 illustrates the circuit state of the level shift circuit in accordance with embodiments of the invention in operation mode (5)

FIG. 14 shows the circuit state of the level shift circuit in accordance with some embodiments of the invention in the operation mode (5). In the operation mode (5), the set signal and reset signal are at the L level, and the dV/dt noise is generated when the latch output is in the reset state (L level). As shown in FIG. 14, since the PM1a, PM1b, PM2a, and PM2b are in the OFF state, the feedback signal from the latch circuit 122 sets the set-side level shift circuit to the resistor parallel connection state and sets the reset-side level shift circuit to the resistor series connection state.

Since the reset-side level shift circuit is in the resistor series connection state, the potential of the resdrn signal inputted to the gate terminal of the PM1 is an intermediate potential of the potential vb and potential vs due to resistor voltage division by the parasitic resistor Rpar2 and series combined resistor (R2+R2M+R2L). Therefore, a state is assumed in which the vb-resdrn impedance on the reset side is higher than the vb-setdrn impedance on the set side. When the dV/dt noise ends and blocking by the latch malfunction protection circuit 121 is canceled, this difference in impedance delays the rise of the resdrn signal, thereby setting the latch circuit 122 again to the reset shape and preventing logical inversion.

Figure 15:
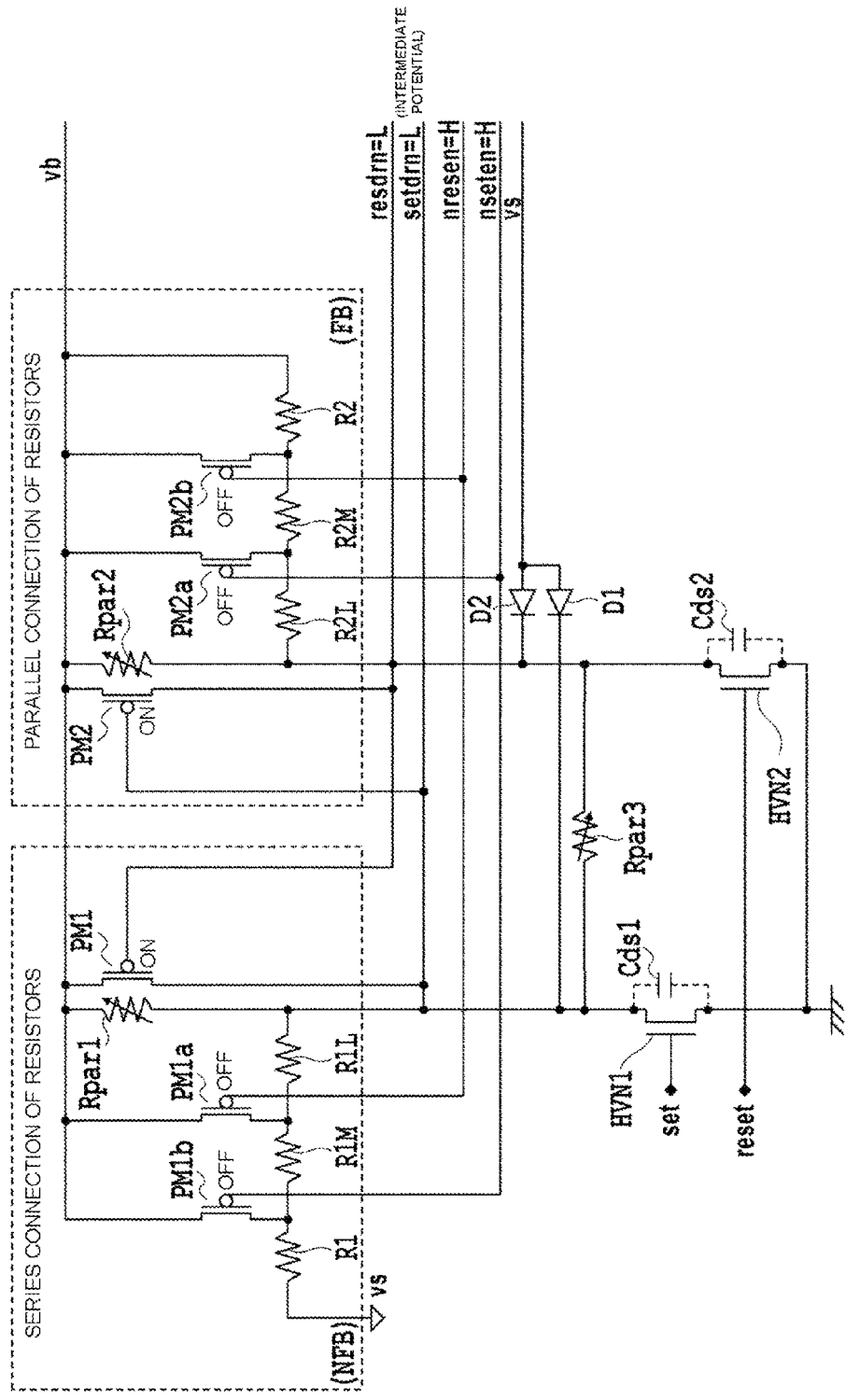
FIG. 15 illustrates the circuit state of the level shift circuit in accordance with embodiments of the invention in operation mode (6)

FIG. 15 shows the circuit state of the level shift circuit in accordance with some embodiments of the invention in the operation mode (6). In the operation mode (6), the set signal and reset signal are at the L level, and the dV/dt noise is generated when the latch output is in the set state (H level). As shown in FIG. 15, since the PM1a, PM1b, PM2a, and PM2b are in the OFF state, the feedback signal from the latch circuit 122 sets the set-side level shift circuit to the resistor series connection state and sets the reset-side level shift circuit to the resistor parallel connection state.

Since the set-side level shift circuit is in the resistor series connection state, the potential of the setdrn signal inputted to the gate terminal of the PM2 is an intermediate potential of the potential vb and potential vs due to resistor voltage division by the parasitic resistor Rpar1 and series combined resistor (R1+R1M+R1L). Therefore, a state is assumed in which the vb-setdrn impedance on the set side is higher than the vb-resdrn impedance on the reset side. When the dV/dt noise ends and blocking by the latch malfunction protection circuit 121 is canceled, this difference in impedance delays the rise of the setdrn signal, thereby setting the latch circuit 122 again to the set shape and preventing logical inversion.

Thus, where the dV/dt noise is generated in a state in which the setdrn signal and resdrn signal are at the H level, the circuit state (nresen signal and nseten signal are at the H level) shown in FIG. 14 or FIG. 15 is assumed and malfunction of the level shift circuit caused by the generation of the dV/dt noise can be prevented. In particular, in the level shift circuit in accordance with the present invention, when the setdrn signal and resdrn signal are at the L level, the setdrn signal and resdrn signal are prevented by the latch malfunction prevention circuit 121 from being inputted to the latch circuit 122, and when the dV/dt noise ends, a difference is provided between the impedances relating to the set-side and reset-side level shift circuits, thereby imparting a difference between the speeds at which the setdrn signal and resdrn signal reach the H level, making the originally present signal long and maintaining the L level (for example, where the output of the latch circuit 122 immediately before the dV/dt noise is inputted is at the H level, the rise of the setdrn signal is delayed), and preventing the latch circuit 122 from erroneous inversion.

As described hereinabove, in order to shorten the rise time of the setdrn signal or resdrn signal when the set signal or reset signal is off, so as to resolve the problem associated with the conventional level shift circuits, it is essential that the PM1*b* or PM2*b* decease the pull-up resistance of the HVN1 or HVN2. For other P-channel MOS transistors the main function is to reduce the dV/dt noise.

EXAMPLE 1

The level shift circuit according to Example 1 of the present invention will be explained below. In the level shift circuit according to Example 1 of the present invention, for example, R1=R2=450 kΩ, R1M=R2M=2 kΩ, and R1L=R2L=1 kΩ.

Figure 18:
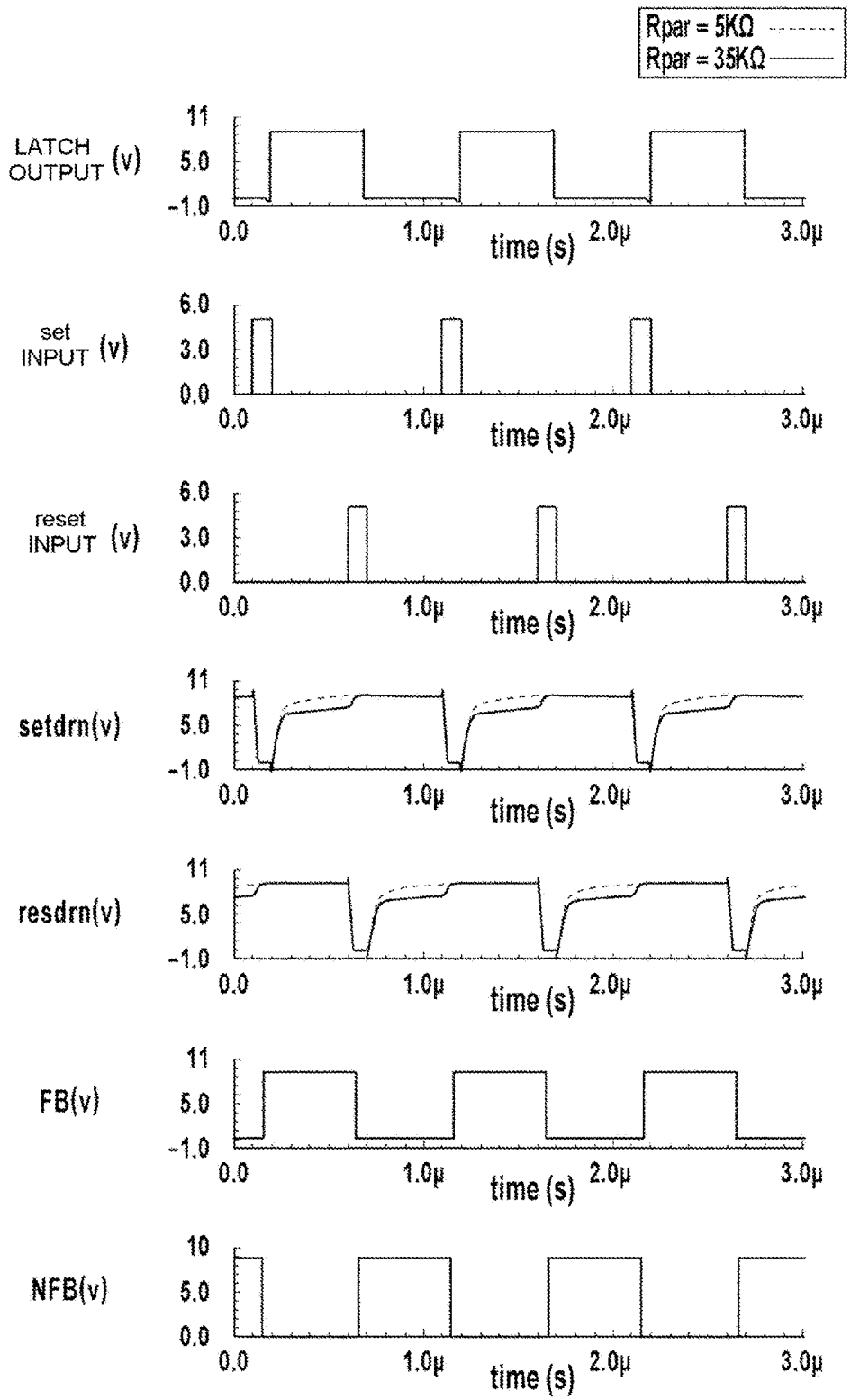
FIG. 18 shows the circuit simulation results obtained for the circuit in accordance with embodiments of the invention when the set signal—reset signal pulse spacing is 0.5 μs.

FIG. 18 shows the operation waveform of the level shift circuit in accordance with some embodiments of the invention obtained when the set-reset pulse spacing is 0.5 μs. FIG. 18 illustrates the cases in which the resistance values of the parasitic resistors Rpar1 and Rpar2 are 5 kΩ and 35 kΩ. According to FIG. 18, it is clear that no delay in the latch output occurs even when the parasitic resistance value changes.

Figure 3:
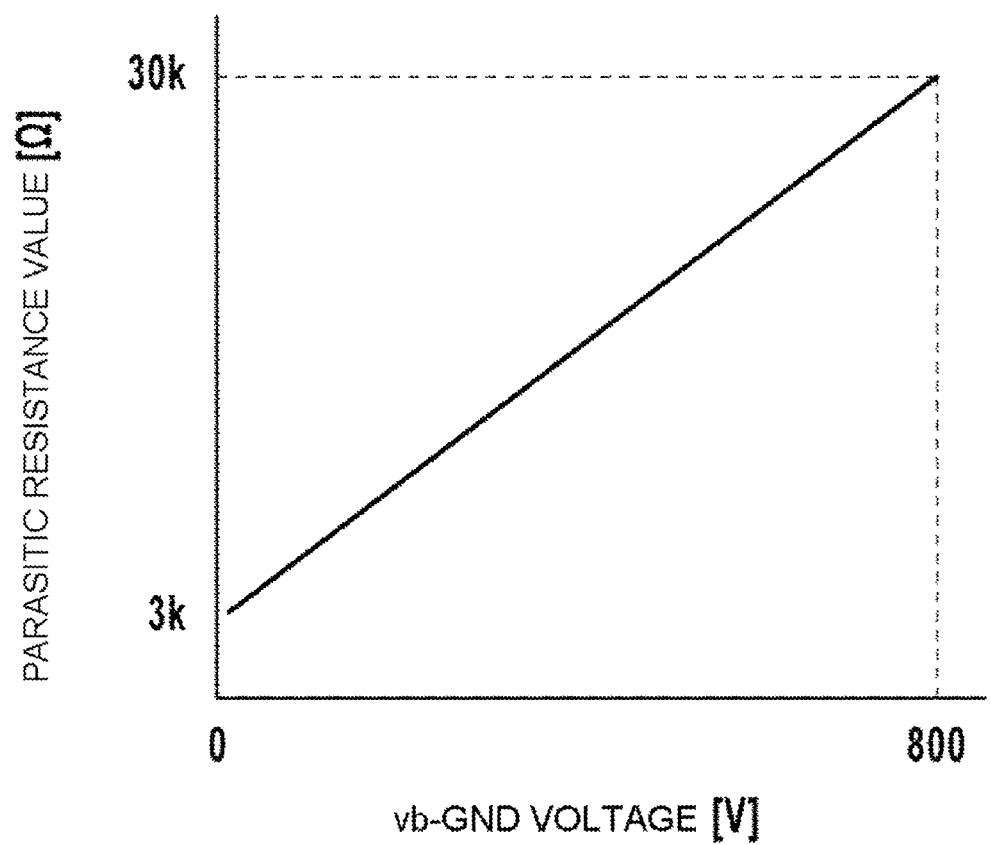
FIG. 3 illustrates how the resistance value of a parasitic resistor depends on voltage.
Figure 4:
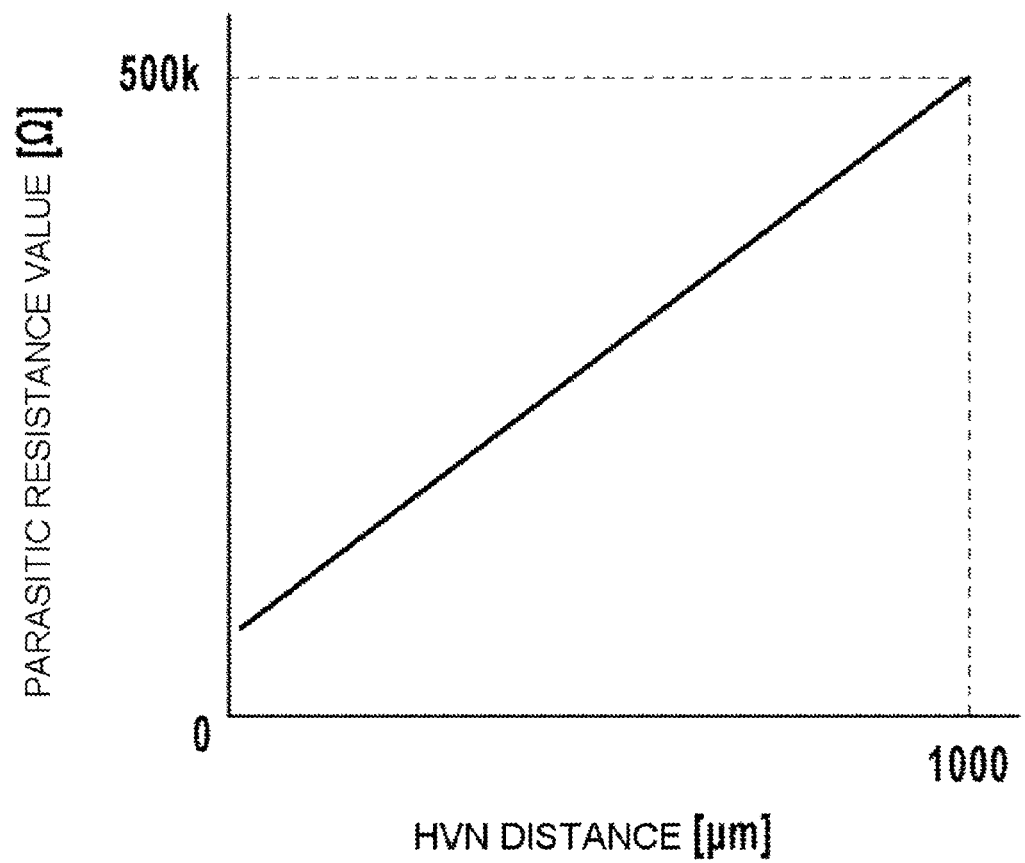
FIG. 4 illustrates how the resistance value of a parasitic resistor depends on the distance between the HVN.
Figure 5:
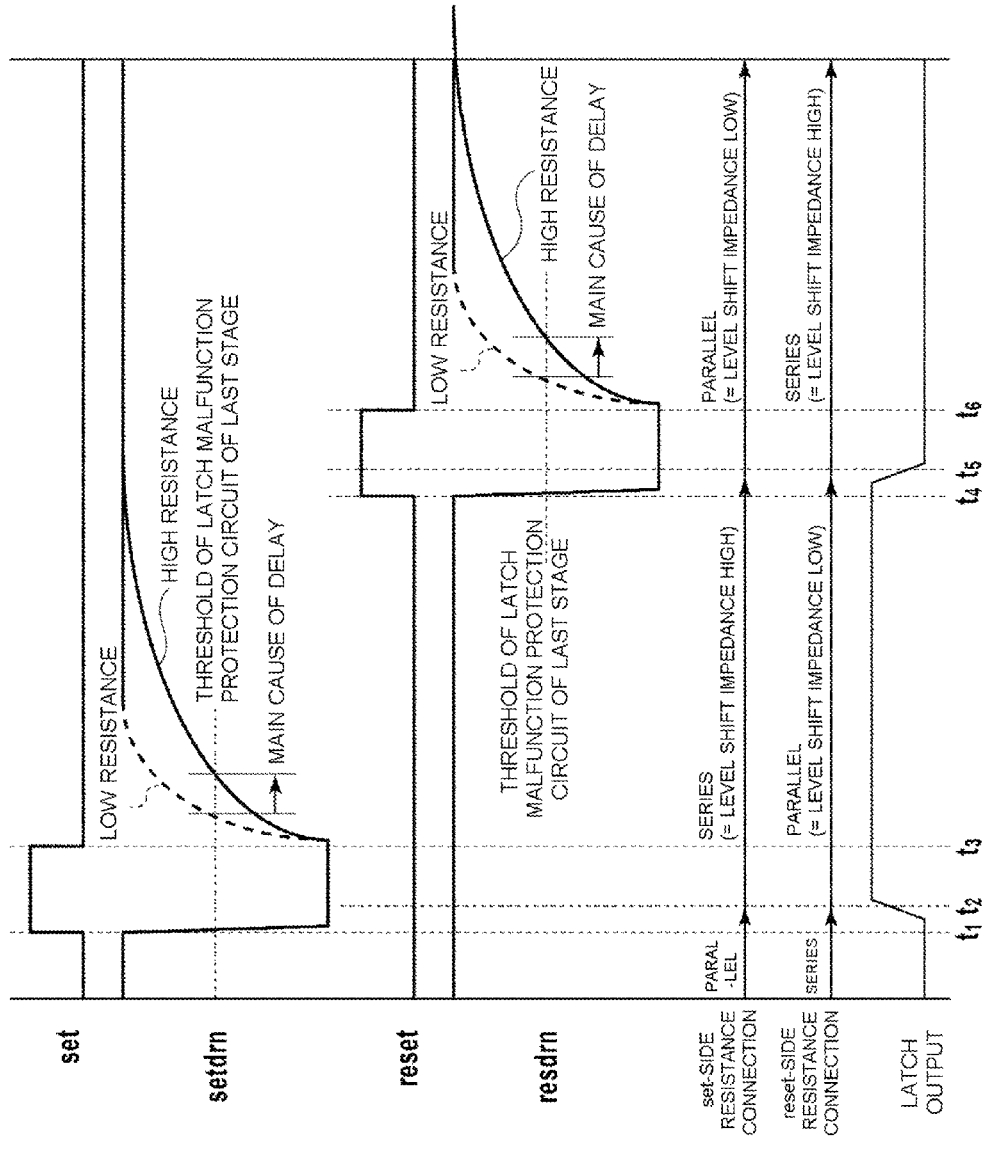
FIG. 5 is a time chart illustrating the operation of the level shift circuit shown in FIG. 1.
Figure 6:
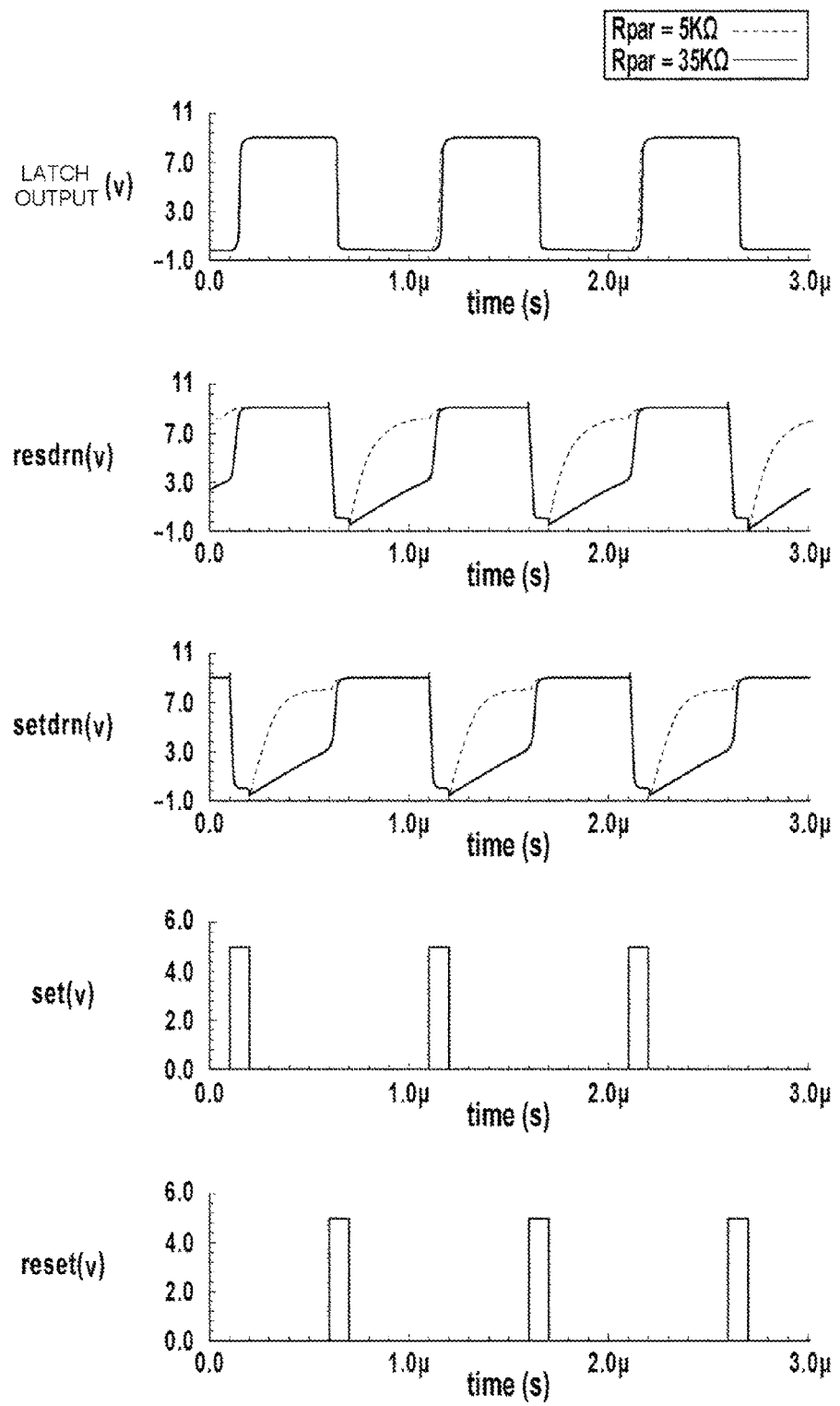
FIG. 6 shows circuit simulation results obtained for the level shift circuit shown in FIG. 1 when the set signal—reset signal pulse spacing is 0.5 μs.
Figure 7:
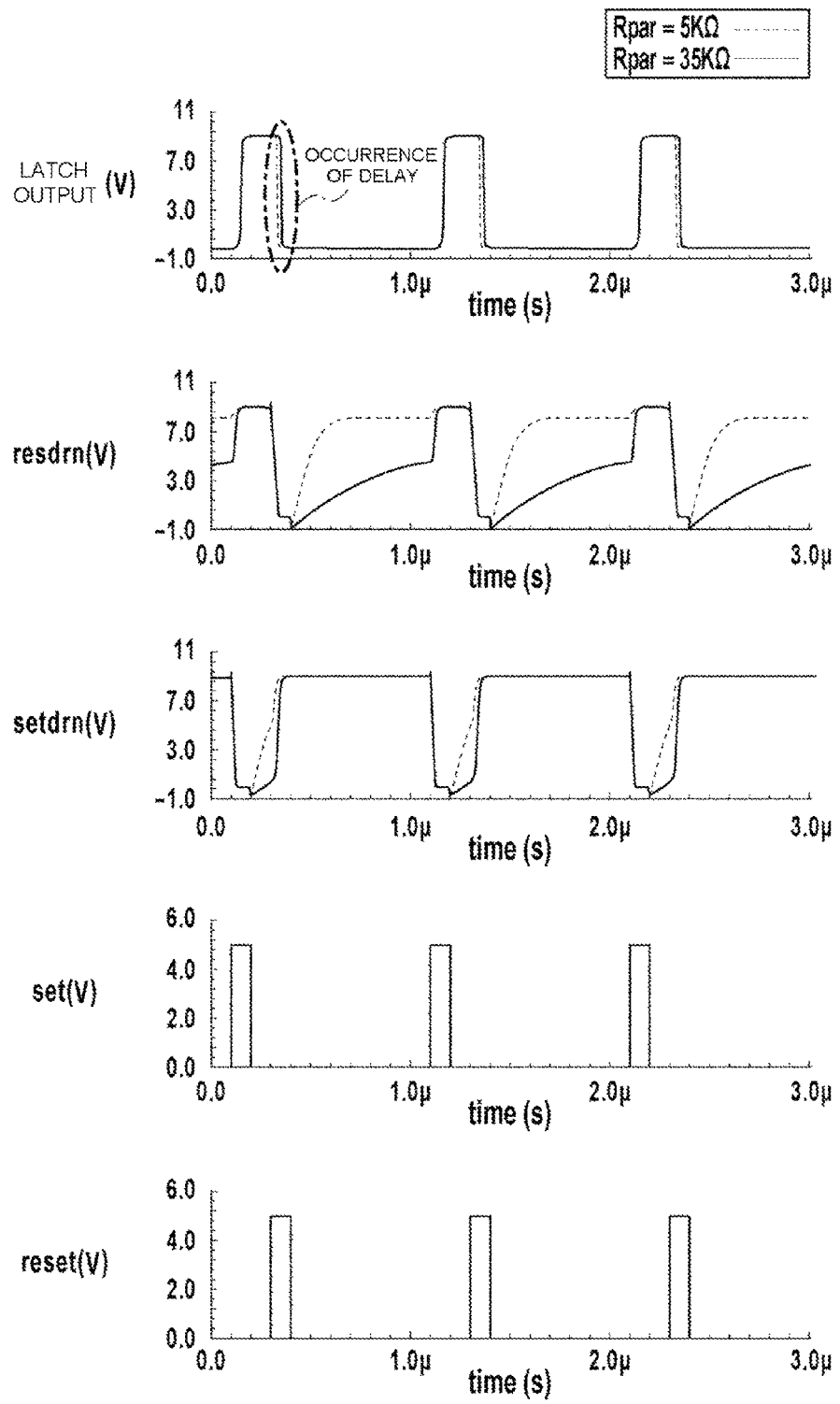
FIG. 7 shows circuit simulation results obtained for the level shift circuit shown in FIG. 1 when the set signal—reset signal pulse spacing is 0.2 μs.
Figure 19:
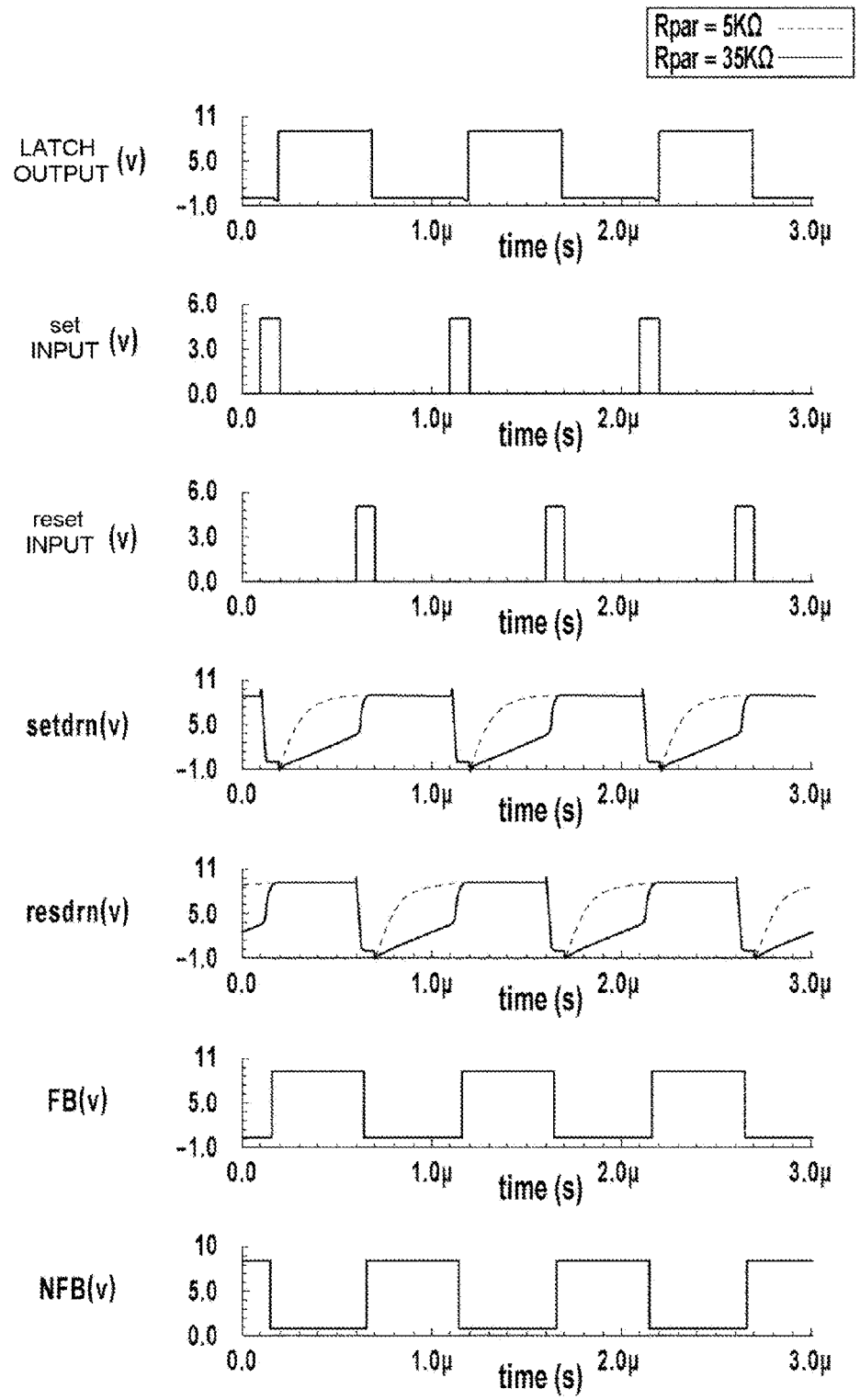
FIG. 19 shows the circuit simulation results obtained for the conventional circuit when the set signal—reset signal pulse spacing is 0.5 μs.

For the purpose of reference, FIG. 19 shows the operation waveform of a level shift circuit according to the conventional system, such as shown in FIG. 3, when the set-reset pulse spacing is 0.5 μs. FIG. 19 illustrates the cases in which the resistance values of the parasitic resistors Rpar1 and Rpar2 are 5 kΩ and 35 kΩ. According to FIG. 19, it is clear that no delay in the latch output occurs even when the parasitic resistance value changes.

Figure 20:
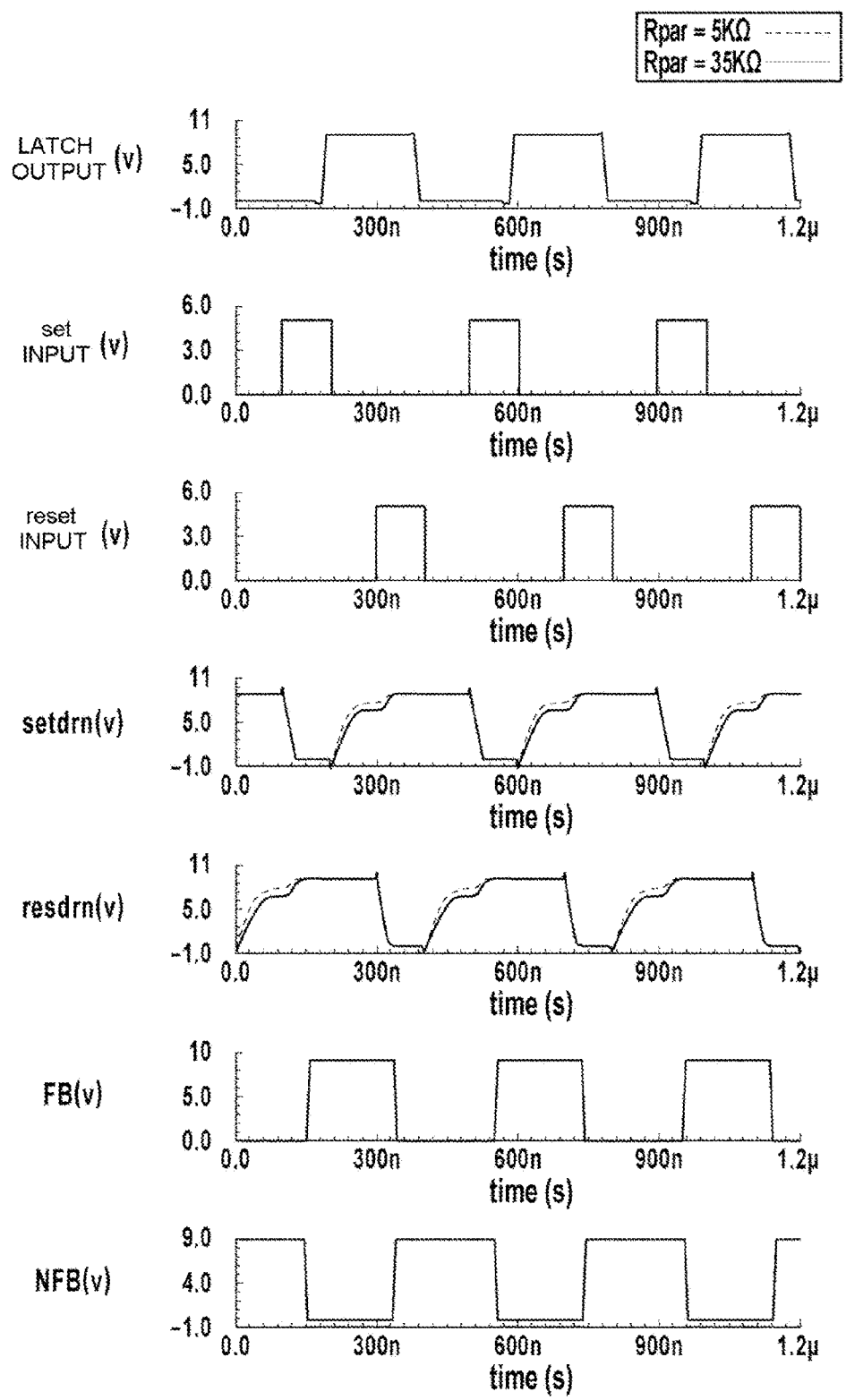
FIG. 20 shows the circuit simulation results obtained for the circuit in accordance with embodiments of the invention when the set signal—reset signal pulse spacing is 0.2 μs.

FIG. 20 shows the operation waveform of the level shift circuit in accordance with some embodiments of the invention obtained when the set-reset pulse spacing is 0.2 μs. FIG. 20 illustrates the cases in which the resistance values of the parasitic resistors Rpar1 and Rpar2 are 5 kΩ and 35 kΩ. According to FIG. 20, it is clear that no delay in the latch output occurs even when the parasitic resistance value changes.

Figure 21:
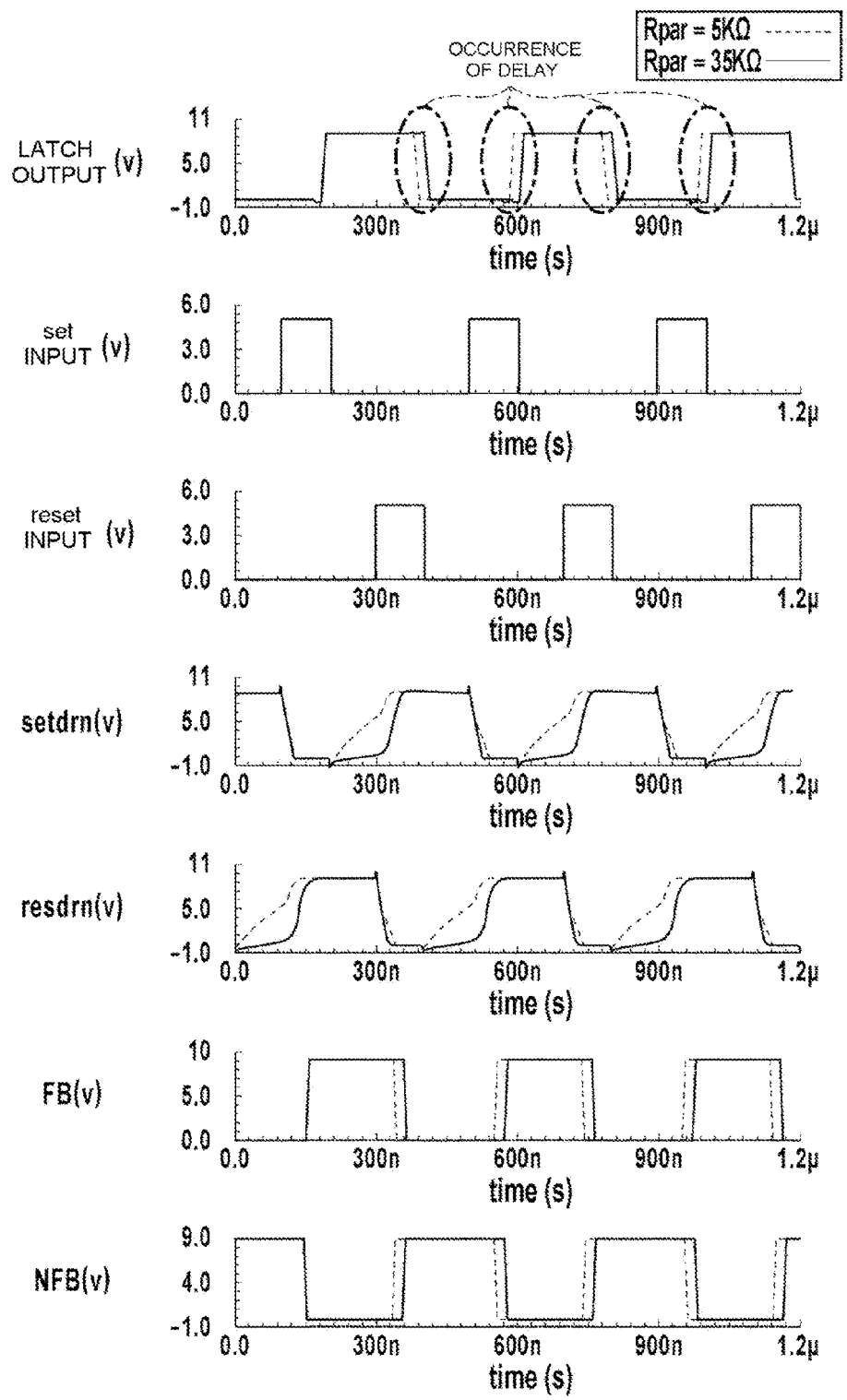
FIG. 21 shows the circuit simulation results obtained for the conventional circuit when the set signal—reset signal pulse spacing is 0.2 μs.

For the purpose of reference, FIG. 21 shows the operation waveform of a level shift circuit according to the conventional system, such as shown in FIG. 3, when the set-reset pulse spacing is 0.2 μs. FIG. 21 illustrates the cases in which the resistance values of the parasitic resistors Rpar1 and Rpar2 are 5 kΩ and 35 kΩ. According to FIG. 21, it is clear that a delay occurs in the latch output.

Therefore it is clear that with the level shift circuit according to Example 1 of the present embodiment, no delay in the latch output occurs even when the set-reset pulse spacing is as small as 0.2 μs.

EXAMPLE 2

The level shift circuit according to Example 2 of some embodiments of the invention will be explained below. In the level shift circuit according to Example 2 of some embodiments of the invention, for example, when the maximum voltage value between vb and vs is 10 V, the allowed current consumption in in the case where the resistors R1 and R2 are connected between vb and vs is 20 μA. In the level shift circuit according to Example 2 of the present invention, the resistance values of the resistors R1 and R1 are 10 V/20 μA=500 kΩ.

When the threshold Vt of the PMOS element of the CMOS circuit (logical elements 251 to 256) of the operation detection circuit 250 is taken as −2 V (where the voltage between vb and vs is taken as 10 V, the threshold using the potential vs as the reference is 8 V) and the series combined resistance value of the resistors R1M, R1L, R2M, and R2L is taken to be the same as the resistance value of the parasitic resistors Rpap1 and Rpar2, where the calculations are performed on the basis of the above-described approach, the following results are obtained: Rpar1=(R1M+R1L)=150 kΩ and Rpar2=(R2M+R2L)=150 kΩ.

The resistance ratio of the resistors RxL and RxM (x is 1 or 2) is a factor determining the resistance values of the combined resistors of the set-side and reset-side level shift circuits in the operation modes (2) and (4). Since the PM1 or PM2 is in the ON state in the operation mode (2) or (4), the impedance of the combined resistor of the level shift circuit in those operation periods becomes almost the ON resistance of the PM1 or PM2. However, since the ON period of the PM1 or PM2 is effective only when the HVN1 or HVN2 is in the ON state, the output response time is reduced after the HVN1 or HVN2 has changed from the ON state to the OFF state (from the operation mode (2) to the operation mode (3), or from the operation mode (4) to the operation mode (1)), and therefore a state is assumed in which the PM1*a* or PM2*a* remains ON for a constant period due to the delay of the operation detection circuit 250. Thus, the impedance of the combined resistor of one level shift circuit becomes Rparx//(RxL+RxM). As a result, the response time is reduced and, at the same time, the relationship between impedances of combined resistances of both level shift circuits acts to prevent the occurrence of malfunction caused by the dV/dt noise.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2012-090994, filed on Apr. 12, 2012. The disclosure of the priority application, in its entirety, including the drawings, claims, and the specification thereof, is incorporated herein by reference.

What is claimed is:

1. A level shift circuit comprising:
a first series circuit in which a first parasitic resistor in a semiconductor substrate, a first switching element connected to an input terminal for receiving input of a first level shift input signal, and a first level shift output terminal for outputting a first level shift output signal are connected in series;
a second series circuit in which a second parasitic resistor in a semiconductor substrate, a second switching element connected to an input terminal for receiving input of a second level shift input signal, and a second level shift output terminal for outputting a second level shift output signal are connected in series;
an operation detection circuit that is connected to the first series circuit and the second series circuit, receives input of the first level shift output signal and the second level shift output signal outputted from the first series circuit and the second series circuit, respectively, and outputs the first level shift output signal, the second level shift output signal, a first detection signal, and a second detection signal, wherein the first detection signal is outputted from a first terminal of the operation detection circuit and is at a low level in response to a first state in which the first level shift output signal is at a low level and the second level shift output signal is at a high level, and the second detection signal is outputted from a second terminal of the operation detection circuit and is at a low level in response to a second state in which the first level shift output signal is at a high level and the second level shift output signal is at a low level;
a latch malfunction protection circuit that inputs the first level shift output signal and the second level shift output signal from the operation detection circuit, outputs a high-impedance signal when both the first level shift output signal and the second level shift output signal are at a low level, and passes and outputs the first level shift output signal and the second level shift output signal without any modification, or outputs a signal obtained by processing on the basis of the first level shift output signal and the second level shift output signal when both the first level shift output signal and the second level shift output signal are not at a low level;
a latch circuit that receives output from the latch malfunction protection circuit, and when the output from the latch malfunction protection circuit is at a low level or a high level, stores a value thereof and outputs the stored value together with an inverted value thereof, and when the output from the latch malfunction protection circuit is at a high impedance, holds a value that has been stored immediately before the input assumes a high impedance and outputs the stored value together with the inverted value of the stored value, wherein one of output terminals of the latch circuit is connected through a first resistor, a second resistor, and a third resistor to the first level shift output terminal, and the other one of output terminals of the latch circuit is connected through a fourth resistor, a fifth resistor, and a sixth resistor to the second level shift output terminal;
a third switching element connected in parallel to the first parasitic resistor, wherein a source terminal of the third switching element is connected to a power source potential, a drain terminal of the third switching element is connected to the first level shift output terminal, and a gate terminal of the third switching element is connected to the second level shift output terminal;
a fourth switching element connected in parallel to the second parasitic resistor, wherein a source terminal of the fourth switching element is connected to a power source potential, a drain terminal of the fourth switching element is connected to the second level shift output terminal, and a gate terminal of the fourth switching element is connected to the first level shift output terminal;
a fifth switching element in which a source terminal is connected to the power source potential, a drain terminal is connected between the first resistor and the second resistor, and a gate terminal is connected to the first terminal of the operation detection circuit; and
a sixth switching element in which a source terminal is connected to the power source potential, a drain terminal is connected between the fourth resistor and the fifth resistor, and a gate terminal is connected to the second terminal of the operation detection circuit.

2. The level shift circuit according to claim 1, further comprising:
a seventh switching element in which a source terminal is connected to the power source potential, a drain terminal is connected between the second resistor and the third resistor, and a gate terminal is connected to the second terminal of the operation detection circuit; and
an eighth switching element in which a source terminal is connected to the power source potential, a drain terminal is connected between the fifth resistor and the sixth resistor, and a gate terminal is connected to the first terminal of the operation detection circuit.

3. The level shift circuit according to claim 1, wherein
the operation detection circuit comprises a logical circuit group constituted by a first inverter, a second inverter, a third inverter, a fourth inverter, a first NAND element, and a second NAND element;
an input terminal of the first inverter and one input terminal of the first NAND element are connected to the first level shift output terminal;
an input terminal of the second inverter and one input terminal of the second NAND element are connected to the second level shift output terminal;
an input terminal of the third inverter and another input terminals of the second NAND element are connected to an output terminal of the first inverter;
an input terminal of the fourth inverter and another input terminals of the first NAND element are connected to an output terminal of the second inverter; and
the first terminal of the operation detection circuit is an output terminal of the second NAND element, and the second terminal of the operation detection circuit is an output terminal of the first NAND element.

4. The level shift circuit according to claim 1, wherein
a resistance ratio of a combined resistance value of the first parasitic resistor and the first to third resistors is adjusted such that a potential level of a signal inputted to each of the logical circuit groups in the operation detection circuit is at a high level with respect to the logical circuit groups when an output of the one output terminal of the latch circuit is at a low level and the first parasitic resistor and the first to third resistors are in a series connection state; and
a resistance ratio of a combined resistance value of the second parasitic resistor and the fourth to sixth resistors is adjusted such that a potential level of a signal inputted to each of the logical circuit groups in the operation detection circuit is at a high level with respect to the logical circuit groups when an output of the other output terminal of the latch circuit is at a low level and the second parasitic resistor and the fourth to sixth resistors are in a series connection state.

5. The level shift circuit according to claim 1, wherein
a series combined resistance value of the second resistor and the third resistor is equal to or less than a resistance value of the first parasitic resistor; and
a series combined resistance value of the fifth resistor and the sixth resistor is equal to or less than a resistance value of the second parasitic resistor.

6. The level shift circuit according to claim 1, wherein an inverter is connected between the latch circuit and the first resistor.

7. A method for determining a resistance value in a level shift circuit that includes a first series circuit in which a first parasitic resistor in a semiconductor substrate, a first switching element connected to an input terminal for receiving input of a first level shift input signal, and a first level shift output terminal for outputting a first level shift output signal are connected in series; a second series circuit in which a second parasitic resistor in a semiconductor substrate, a second switching element connected to an input terminal for receiving input of a second level shift input signal, and a second level shift output terminal for outputting a second level shift output signal are connected in series; an operation detection circuit that is connected to the first series circuit and the second series circuit, receives input of the first level shift output signal and the second level shift output signal outputted from the first series circuit and the second series circuit, respectively, and outputs the first level shift output signal, the second level shift output signal, a first detection signal, and a second detection signal, wherein the first detection signal is outputted from a first terminal of the operation detection circuit and is at a low level in response to a first state in which the first level shift output signal is at a low level and the second level shift output signal is at a high level, and the second detection signal is outputted from a second terminal of the operation detection circuit and is at a low level in response to a second state in which the first level shift output signal is at a high level and the second level shift output signal is at a low level; a latch malfunction protection circuit that inputs the first level shift output signal and the second level shift output signal from the operation detection circuit, outputs a high-impedance signal when both the first level shift output signal and the second level shift output signal are at a low level, and passes and outputs the first level shift output signal and the second level shift output signal without any modification, or outputs a signal obtained by processing on the basis of the first level shift output signal and the second level shift output signal when both the first level shift output signal and the second level shift output signal are not at a low level; a latch circuit that receives output from the latch malfunction protection circuit, and when the output from the latch malfunction protection circuit is at a low level or a high level, stores a value thereof and outputs the stored value together with an inverted value thereof, and when the output from the latch malfunction protection circuit is at a high impedance, holds a value that has been stored immediately before the input assumes a high impedance and outputs the stored value together with the inverted value of the stored value, wherein one of output terminals of the latch circuit is connected through a first resistor, a second resistor, and a third resistor to the first level shift output terminal, and the other one of output terminals of the latch circuit is connected through a fourth resistor, a fifth resistor, and a sixth resistor to the second level shift output terminal; a third switching element connected in parallel to the first parasitic resistor, wherein a source terminal of the third switching element is connected to a power source potential, a drain terminal of the third switching element is connected to the first level shift output terminal, and a gate terminal of the third switching element is connected to the second level shift output terminal; a fourth switching element connected in parallel to the second parasitic resistor, wherein a source terminal of the fourth switching element is connected to a power source potential, a drain terminal of the fourth switching element is connected to the second level shift output terminal, and a gate terminal of the fourth switching element is connected to the first level shift output terminal; a fifth switching element in which a source terminal is connected to the power source potential, a drain terminal is connected between the first resistor and the second resistor, and a gate terminal is connected to the first terminal of the operation detection circuit; and a sixth switching element in which a source terminal is connected to the power source potential, a drain terminal is connected between the fourth resistor and the fifth resistor, and a gate terminal is connected to the second terminal of the operation detection circuit, the method comprising:

determining, in the first state, a resistance value of the first resistor by a current consumption tolerance value in the first resistor and a maximum value of the power source potential, and determining resistance values of the first parasitic resistor, the second resistor, and the third resistor on the basis of the determined resistance value of the first resistor; and determining, in the second state, a resistance value of the second resistor by a current consumption tolerance value in the second resistor and a maximum value of the power source potential, and determining resistance values of the second parasitic resistor, the fifth resistor, and the sixth resistor on the basis of the determined resistance value of the second resistor.

* * * * *